(12) United States Patent
Shibazaki

(10) Patent No.: US 9,557,656 B2
(45) Date of Patent: Jan. 31, 2017

(54) STAGE APPARATUS AND EXPOSURE APPARATUS

(75) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 2395 days.

(21) Appl. No.: 11/791,992

(22) PCT Filed: Nov. 30, 2005

(86) PCT No.: PCT/JP2005/021973
§ 371 (c)(1),
(2), (4) Date: Jun. 12, 2007

(87) PCT Pub. No.: WO2006/059634
PCT Pub. Date: Jun. 8, 2006

(65) Prior Publication Data
US 2008/0060828 A1    Mar. 13, 2008

(30) Foreign Application Priority Data

Dec. 1, 2004 (JP) ................................ 2004-348682

(51) Int. Cl.
*H01L 21/673* (2006.01)
*G03F 7/20* (2006.01)

(52) U.S. Cl.
CPC ....... *G03F 7/70716* (2013.01); *G03F 7/70941* (2013.01); *G03F 7/70991* (2013.01)

(58) Field of Classification Search
CPC .......................... G03F 7/70691; G03F 7/70725
See application file for complete search history.

(56) References Cited

U.S. PATENT DOCUMENTS

| | | |
|---|---|---|
| 4,999,507 A | 3/1991 | Clemens et al. |
| 5,528,118 A | 6/1996 | Lee |
| 5,623,853 A | 4/1997 | Novak et al. |
| 5,646,413 A | 7/1997 | Nishi |
| 5,874,820 A | 2/1999 | Lee |
| 5,969,441 A | 10/1999 | Loopstra et al. |
| 6,208,407 B1 | 3/2001 | Loopstra |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,633 B1 | 7/2003 | Nishi et al. |
| 6,590,634 B1 | 7/2003 | Nishi et al. |
| 6,600,162 B1 | 7/2003 | Hahmann et al. |

(Continued)

FOREIGN PATENT DOCUMENTS

| | | |
|---|---|---|
| EP | 0 867 773 A2 | 9/1998 |
| EP | 1 319 986 A1 | 6/2003 |

(Continued)

OTHER PUBLICATIONS

Extended European Search Report issued in European Patent Application No. 05811520.5 dated Apr. 16, 2009.

(Continued)

*Primary Examiner* — Daborah Chacko Davis
(74) *Attorney, Agent, or Firm* — Oliff PLC

(57) ABSTRACT

A stage apparatus includes a first movable stage that moves while holding an article, an electrical contact that is provided on the first movable stage, and a grounding device that comes into contact with the electrical contact and grounds the first movable stage when the article is not processed.

26 Claims, 12 Drawing Sheets

(56) References Cited

U.S. PATENT DOCUMENTS

| | | |
|---|---|---|
| 2003/0132400 A1 | 7/2003 | Jacobs et al. |
| 2003/0164934 A1 | 9/2003 | Nishi et al. |
| 2005/0016685 A1* | 1/2005 | Emoto et al. ............ 156/345.51 |
| 2005/0128449 A1 | 6/2005 | Phillips |
| 2008/0013060 A1 | 1/2008 | Ichinose et al. |
| 2008/0192226 A1 | 8/2008 | Shibazaki |

FOREIGN PATENT DOCUMENTS

| | | |
|---|---|---|
| EP | 1 780 786 A1 | 5/2007 |
| EP | 1 811 526 A1 | 7/2007 |
| JP | A-04-287946 | 10/1992 |
| JP | A-05-315429 | 11/1993 |
| JP | A 7-176468 | 7/1995 |
| JP | A-8-83832 | 3/1996 |
| JP | A 8-166475 | 6/1996 |
| JP | A-08-233964 | 9/1996 |
| JP | A 8-330224 | 12/1996 |
| JP | A 10-163099 | 6/1998 |
| JP | A 10-214783 | 8/1998 |
| JP | A 10-270535 | 10/1998 |
| JP | A 11-219882 | 8/1999 |
| JP | A-2000-100918 | 4/2000 |
| JP | A 2000-505958 | 5/2000 |
| JP | A-2001-085506 | 3/2001 |
| JP | A 2001-133959 | 5/2001 |
| JP | A-2002-043213 | 2/2002 |
| JP | A-2002-530855 | 9/2002 |
| JP | A-2003-257851 | 9/2003 |
| JP | A-2004-128270 | 4/2004 |
| JP | A-2007-514319 | 5/2007 |
| WO | WO 00/30146 | 5/2000 |
| WO | WO 2005/122242 A1 | 12/2005 |
| WO | WO 2006/009254 A1 | 1/2006 |

OTHER PUBLICATIONS

International Search Report issued in International Patent Application No. PCT/JP2005/021973 dated Jan. 17, 2006 (with translation).
Written Opinion issued in International Patent Application No. PCT/JP2005/021973 dated Jan. 17, 2006 (with translation).
Office Action issued in Japanese Patent Application No. 2006-547972 dated Apr. 5, 2011 (with translation).
Office Action issued in European Patent Application No. 05811520.5 dated Jun. 29, 2011.
Office Action issued in Japanese Patent Application No. 2006-547972 dated Sep. 20, 2011 (with translation).
Oct. 31, 2011 Office Action issued in Korean Patent Application No. 10-2007-7004094 (with translation).
Nov. 23, 2012 Office Action issued in Taiwanese Patent Application No. 094142000 (with translation).

* cited by examiner

STAGE APPARATUS AND EXPOSURE APPARATUS

TECHNICAL FIELD

The present invention relates to a stage apparatus and an exposure apparatus, and in particular, to a stage apparatus and an exposure apparatus that can be suitably used when a predetermined processing is performed using electrical power.

This application claims priority to Japanese Patent Application No. 2004-348682 filed on Dec. 1, 2004, the disclosure of which is incorporated herein by reference in its entirety.

BACKGROUND ART

In a lithography process as one of the manufacturing processes of a semiconductor device, various exposure apparatuses that transfers a circuit pattern formed in a mask or reticle (hereinafter, referred to as reticle) to a photosensitive substrate, such as a wafer or a glass plate, on which resist (sensitizer) is coated, are used.

For example, as an exposure apparatus for a semiconductor device, with the reduction of the minimum line width of the pattern according to high integration of an integrated circuit (device rule), a reduction projection exposure apparatus that transfers the pattern of the reticle on the wafer at a reduced scale using a projection optical system is mainly used.

In the above-described exposure apparatus, after exposure to a predetermined shot region on the wafer is performed, exposure to other shot regions is sequentially repeated. Accordingly, an error in relative position between the projection optical system and the wafer is caused by vibration due to movement of a wafer stage (in case of a stepper), or a reticle stage and wafer stage (in case of a scanning stepper). Then, the pattern is transferred at a different position on the wafer from a position corresponding to a design value. Therefore, if a vibration component is included in the positional error, image blurring (increase in pattern line width) may be generated.

Generally, a power supply member that supplies various kinds of power, such as a cable that supplies electric power to a driving unit such as motors disposed in the stage, a coolant pipe that cools the motors, a coolant pipe that keeps the stage at a predetermined temperature, a vacuum pipe that exhausts a vacuum absorption hole provided at a substrate placing surface to vacuum, is connected to the above-described stage (hereinafter, the cable and pipes are collectively referred to as cables). Then, fine vibration is caused by a tension applied according to the movement of the stage, and the reaction force thereof. Accordingly, precision of the pattern transfer may be degraded.

In Patent Document 1, there is disclosed a configuration in which a battery is mounted on a stage. Here, when the stage is provided at a wafer replacement position, a power transmission terminal provided in a base structure and a power receiving terminal provided in the stage are brought into contact with each other, such that the battery is charged with a current to be supplied from the power transmission terminal through the power receiving terminal. Further, when the stage is spaced apart from the wafer replacement position, a predetermined processing is performed using electrical power from the battery.

With this configuration, electrical wiring lines to the stage are not needed during a predetermined processing, such as an exposure processing or the like. Accordingly, dynamic and static characteristics of the stage can be improved.

Patent Document 1: Japanese Patent Application, Publication No. H10-270535

DISCLOSURE OF INVENTION

Problems to be Solved by the Invention

However, the above-described prior art has the following problems.

The stage is charged with static electricity during a predetermined processing, and discharge of the static electricity negatively effects the devices attached to the stage, or may damage the pattern formed on the wafer.

A purpose of some aspects of the invention is to provide a stage apparatus and an exposure apparatus that can exclude problems, such as vibration due to connection of cables, and can suppress an adverse effect due to static electricity.

Means for Solving the Problem

According to an aspect of the invention, a stage apparatus includes a first movable stage that moves while holding an article, an electrical contact that is provided on the first movable stage, and a grounding device that comes into contact with the electrical contact and grounds the first movable stage when the article is not processed.

In the stage apparatus according to the aspect of the invention, even though the first movable stage is charged with static electricity, the static electricity is discharged from the electrical contact by the connection of the grounding device when the article is not processed, such that the static electricity can be suppressed from being accumulated in the first movable stage. Further, since the grounding device does not come into contact with the first movable stage when the article is processed, an adverse effect on dynamic and static characteristics of the stage can be prevented.

According to another aspect of the invention, there is provided an exposure apparatus that exposes a pattern to a substrate using a stage apparatus. As the stage apparatus, the above-described stage apparatus is used.

In the exposure apparatus according to another aspect of the invention, the first movable stage is driven without connecting wiring lines for the removal of static electricity, thereby performing an exposure processing. Accordingly, transfer precision of the pattern can be prevented from being degraded due to the vibration of the wiring lines and the like. Further, the static electricity of the first movable stage can be smoothly discharged. Therefore, the attached devices or the article, such as a substrate or the like, can be prevented from being damaged.

According to still another aspect of the invention, there is provided an exposure method that exposes a pattern to a substrate using a stage apparatus, which moves while holding the substrate. The exposure method includes grounding the stage apparatus, removing the exposed substrate from the stage apparatus after grounding is completed, and releasing grounding of the stage apparatus after an unexposed substrate is placed. Accordingly, static electricity that is generated when the substrate is replaced can be effectively discharged.

Advantage of the Invention

According to the aspects of the invention, an adverse effect on the devices attached to the stage by discharge of the static electricity or a damage of the pattern formed in the article can be prevented. In addition, vibration due to the connection of the cables can be suppressed, thereby preventing degradation of the transfer precision of the pattern.

BEST MODE FOR CARRYING OUT THE INVENTION

Figure 1:
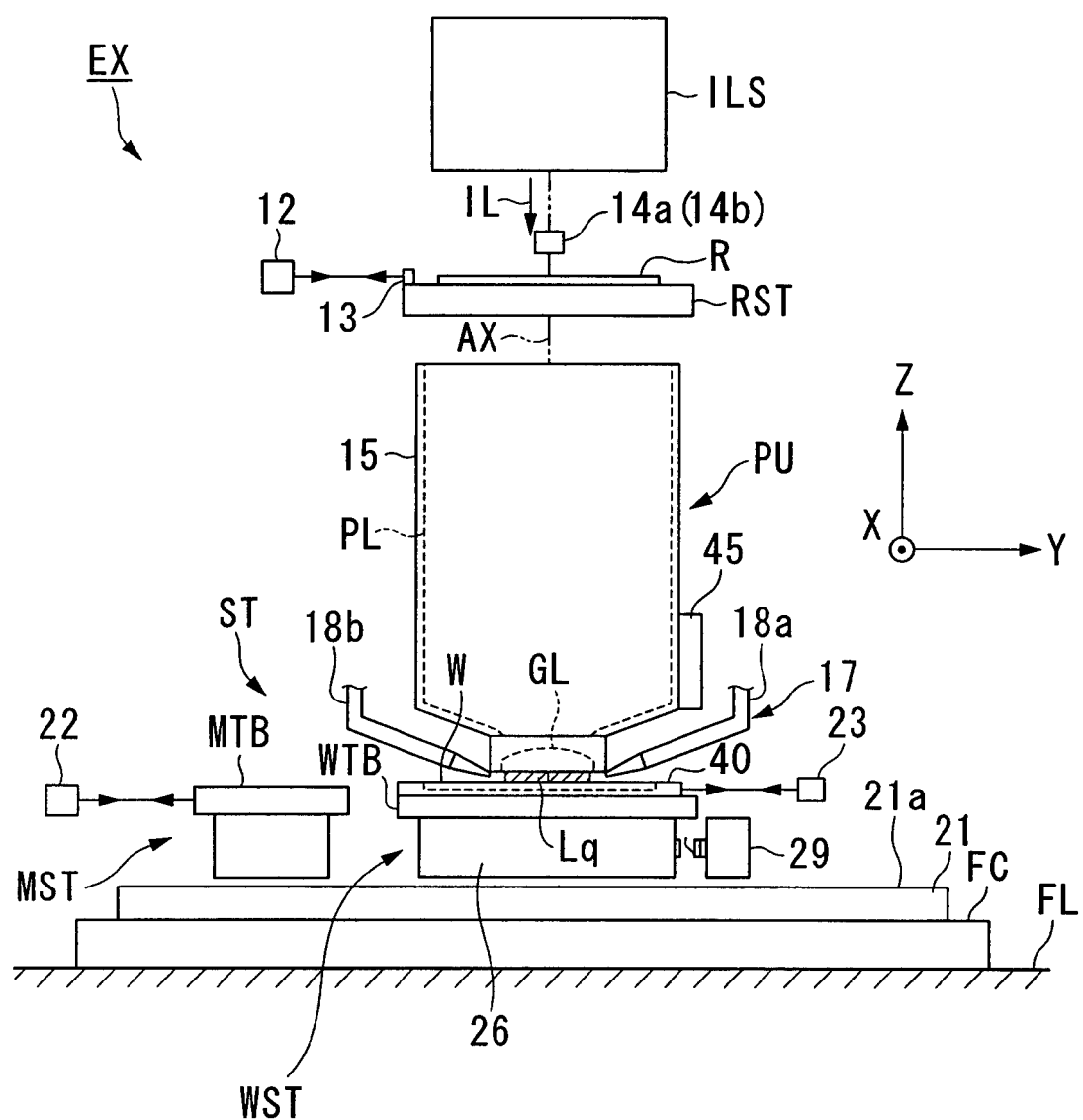
FIG. 1 is a side view showing the schematic configuration of an exposure apparatus according to an embodiment of the invention.

Hereinafter, embodiments of a stage apparatus and an exposure apparatus of the invention will be described with reference to FIGS. 1 to 11. FIG. 1 is a side view showing the schematic configuration of an exposure apparatus according to an embodiment of the invention. An exposure apparatus EX shown in FIG. 1 is a scanning type exposure apparatus of step-and-scan system that, while relatively moving a reticle R as a mask and a wafer W as a substrate with respect to a projection optical system PL in FIG. 1, sequentially transfers a pattern formed in the reticle R to the wafer W.

In the following description, if necessary, an XYZ rectangular coordinate system is established in the drawing, and the positional relationship in relation to individual members will be described with reference to the XYZ rectangular coordinate system. The XYZ rectangular coordinate system shown in FIG. 1 is established such that an X axis and a Y axis resides in a plane parallel to a moving plane of the wafer W, and a Z axis is established in a direction according to an optical axis AX of the projection optical system PL. Further, in this embodiment, a Y direction is established in a direction (scanning direction) in which the reticle R and the wafer W are synchronously moved.

As shown in FIG. 1, the exposure apparatus EX of this embodiment includes an illumination optical system ILS, a reticle stage RST that holds the reticle R as a mask, a projection unit PU, a stage apparatus ST that has a wafer stage WST serving as a substrate stage for holding the wafer W as a substrate and a measurement stage MST, and a control system therefor. The illumination optical system ILS illuminates a slit-shaped illumination region on the reticle R defined by a reticle blind (not shown) with illumination light (exposure light) IL at almost uniform illuminance. Here, as illumination light IL, for example, ArF excimer laser light (193 nm wavelength) is used.

The reticle R having a pattern formed on a pattern plane (a plane on a −Z side in FIG. 1) is held on the reticle stage RST, for example, by vacuum absorption. The reticle stage RST is configured to be finely drivable within an XY plane perpendicular to an optical axis of the illumination optical system ILS (consistent with the optical axis AX of the projection optical system PL described below) and to be drivable at a scanning speed defined in the scanning direction (Y direction) by a reticle stage driving unit 11 (not shown in FIG. 1) (see FIG. 7) including, for example, a linear motor.

A position (including a rotation around the Z axis) within the stage moving plane of the reticle stage RST is constantly detected by a laser interferometer (hereinafter, referred to as 'reticle interferometer') 12 through a movable mirror 13 (actually, a Y movable mirror having a reflecting surface perpendicular to the Y axis and an X movable mirror having a reflecting surface perpendicular to the X axis are provided), for example, at resolution of approximately 0.5 to 1 nm. The measurement value of the reticle interferometer 12 is output to a main control device 20 (not shown in FIG. 1) (see FIG. 7). Then, the main control device 20 calculates the position of the reticle stage RST in the X direction, the Y direction, and a θZ direction (a rotation direction around the Z axis) on the basis of the measurement value of the reticle interferometer 12. Then, the main control device 20 controls the reticle stage driving unit 11 on the basis of the calculation result so as to control the position (and speed) of the reticle stage RST.

A pair of reticle alignment detection systems 14a and 14b that have a TTR (Through The Reticle) alignment system using light of the same wavelength as exposure light are provided above the reticle stage RST to be spaced at a predetermined distance in the X direction. The reticle alignment detection systems 14a and 14b detect a pair of reticle alignment marks on the reticle R and a conjugate image through the projection optical system PL of a pair of reference marks (hereinafter, referred to as 'first reference mark') on the measurement stage MST corresponding to the reticle alignment marks at the same time. For the reticle alignment detection systems 14a and 14b, for example, the same configuration as disclosed in Japanese Patent Application, Publication No. H07-176468 (corresponding U.S. Pat. No. 5,646,413) is used.

The projection unit PU includes a lens barrel 15 and the projection optical system PL that includes a plurality of optical elements held at a predetermined positional relationship in the lens barrel 15. As the projection optical system PL, for example, a dioptric system that includes a plurality of lenses (lens elements) each having a common optical axis AX in the Z direction is used.

Further, an off-axis type alignment system 45 is provided in a holding member that holds the projection unit PU, such that the position of a target mark (an alignment mark formed in the wafer W or the like) is measured.

Further, the exposure apparatus EX of this embodiment performs exposure using a liquid immersion method. Accordingly, a liquid supply nozzle 18a and a liquid recovery nozzle 18b that constitute an immersion apparatus 17 are provided in the vicinity of a lens (hereinafter, also referred to as 'front lens') GL serving as an optical element that is most on an image plane side (wafer W side) of the optical elements constituting the projection optical system PL.

Here, as the liquid, ultrapure water (hereinafter, simply noted as 'water' except in cases where it is particularly necessary) that transmits ArF excimer laser light (light of 193 nm wavelength) is used. Ultrapure water can be easily obtained from a semiconductor manufactory in large quantities. Further, ultrapure water has an advantage in that it does not have an adverse effect on a photoresist coated on the wafer W, an optical lens and the like. Here, the refractive index n of water is approximately 1.44, and the wavelength of illumination light IL is shortened to 193 nm×1/n=approximately 134 nm in water.

The liquid supply nozzle 18a supplies water to a space between the front lens GL and the wafer W according to the instruction of the main control device 20. Further, the liquid recovery nozzle 18b recovers water from the space between the front lens GL and the wafer W according to the instruction of the main control device 20.

As described above, the immersion apparatus 17 that is provided in the exposure apparatus of this embodiment is a local immersion apparatus that includes the liquid supply nozzle 18a, the liquid recovery nozzle 18b, and the like. Moreover, even when the measurement stage MST is located below the projection unit PU, water can be filled in a space between a measurement table MTB and the front lens GL in the same manner.

The stage apparatus ST includes a frame caster FC that is disposed on a floor surface FL of, for example, a semiconductor manufactory, a base plate 21 that is provided on the frame caster FC, the wafer stage (first movable stage) WST and the measurement stage MST that are disposed above the base plate 21 and move along an upper surface 21a (moving plane) of the base plate 21, an interferometer system 24 (see FIG. 7) that includes interferometers 22 and 23 for detecting the positions of the stages WST and MST; and a stage driving unit 25 (see FIG. 7) that drives the stages WST and MST. The above-described wafer stage WST moves while holding the wafer W in order to expose and transfer the pattern of the reticle R to the wafer W. Meanwhile, the measurement stage MST is located below the projection optical system PL while the wafer stage WST is located at a loading position for replacing the wafer W, and performs various measurements.

Figure 2:
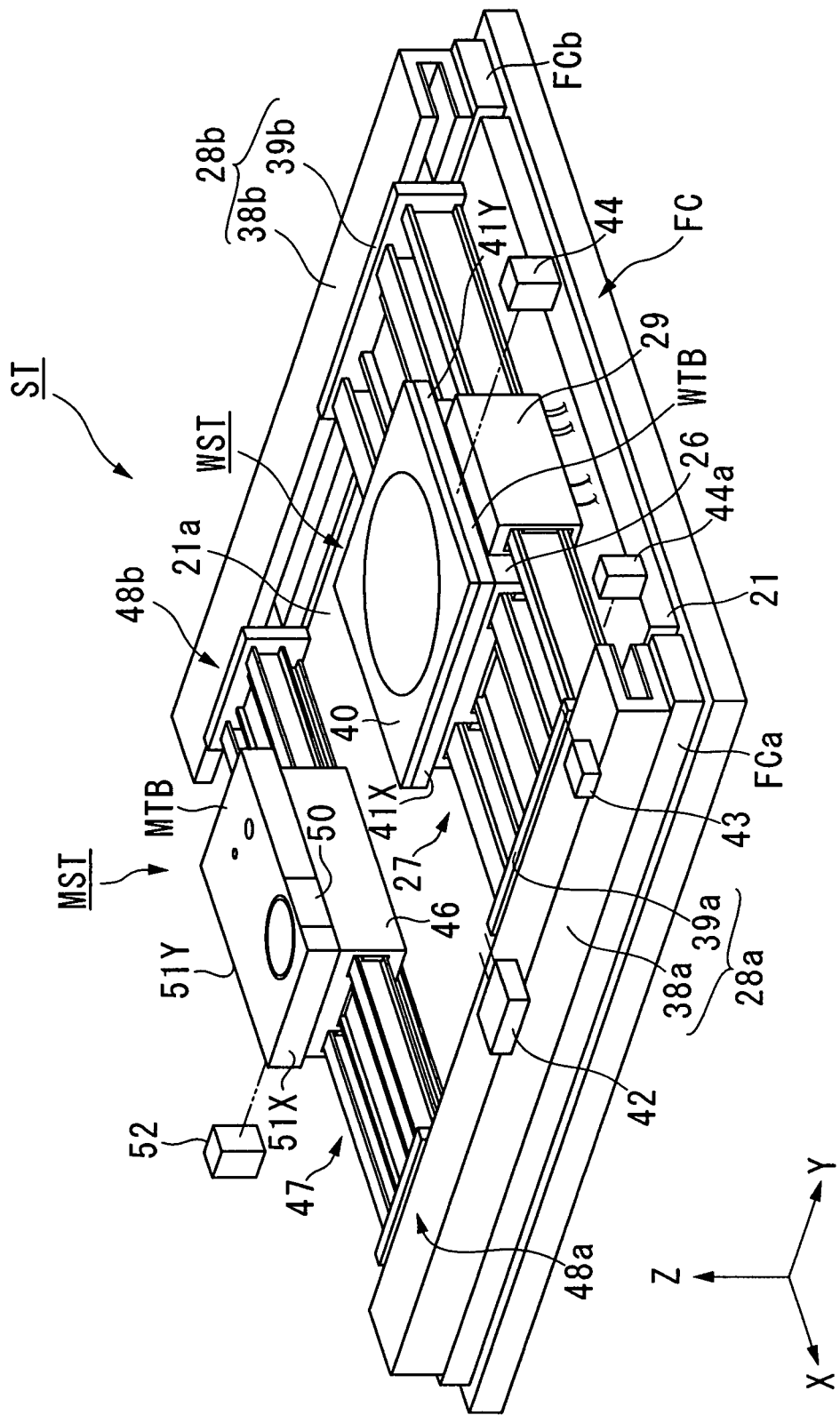
FIG. 2 is a perspective view showing the configuration of a stage apparatus.

Next, the configuration of the stage apparatus ST will be described in detail. FIG. 2 is a perspective view showing the configuration of the stage apparatus ST. As shown in FIG. 2, the substantially flat plate-shaped frame caster FC includes upwardly protruding portions FCa and FCb that are integrally formed in the vicinity of both ends in the X direction with the Y direction as a longitudinal direction. The base plate (platen) 21 is disposed on a region that is interposed by the protruding portions FCa and FCb of the frame caster FC. The upper surface 21a of the base plate 21 is finished with an extremely high degree of flatness and forms a guide surface when the wafer stage WST and the measurement stage MST move along the XY plane.

The wafer stage WST is formed of a nonconductive material, such as ceramics or the like. As shown in FIG. 2, the wafer stage MST includes a wafer stage main body 26 that is disposed on the base plate 21, and a wafer table WTB that is mounted on the wafer stage main body 26. The wafer stage main body 26 has a hollow member that has a rectangular frame shape in cross-section and extends in the X direction. A self weight cancelling mechanism, such as one described in Japanese Patent Application No. 2004-215434 (corresponding PCT International Publication No. WO 2006/009254) filed earlier by the present applicant, is provided at a lower surface of the wafer stage main body 26. The self weight cancelling mechanism has a support that supports the wafer stage WST by applying internal pressure to a bellows, and an air bearing that faces the moving plane 21a as the guide surface and levitates the wafer stage WST with respect to the moving plane 21a.

The wafer stage WST includes a first driving system 27 that drives the wafer stage main body 26 in the X direction with a long stroke and finely drives the wafer stage main body 26 in the Y direction, the Z direction, the θx direction (a rotation direction around the X axis), the θy direction (a rotation direction around the Y axis), and the θz direction (a rotation direction around the Z axis), and a second driving system 28a and 28b that drives the wafer stage main body 26 and the first driving system 27 in the Y direction with a long stroke. In addition, the wafer stage WST includes a tube carrier (second movable stage) 29 that uniformly moves in the X direction, a gaseous supply device 155 (power supply device; see FIGS. 3A and 3B) that transfers utility, such as vacuum or air, from the tube carrier 29 to the wafer stage main body 26 in a non-contact manner, and an electrical supply device 100 (grounding device; see FIG. 5) that supplies power, such as electrical power or the like, from the tube carrier 29 to the wafer stage main body 26 and grounds the wafer stage main body 26 (wafer stage WST).

Here, the uniform movement of the tube carrier 29 in the X direction is to reduce an effect of a reaction force due to driving of the tube carrier 29 on the wafer stage main body 26.

A gas supply path and a gas exhaust path (not shown) are formed in the tube carrier 29. One ends of a gas supply pipe 203 and a gas exhaust pipe 204 are connected to one ends of the gas supply path and the gas exhaust path, respectively. Further, one ends of a supply pipe 241b and a vacuum pipe 241a (see FIG. 3A) are connected to the other ends of the gas supply path and the gas exhaust path, respectively, through a connector (not shown). The other ends of the supply pipe 241b and the vacuum pipe 241a are connected to the gaseous supply device 155.

Further, the other ends of the gas supply path and the gas exhaust path are connected to a gas supply device 201 and a vacuum absorption device 202 (see FIG. 7) that are provided outside the stage apparatus ST.

The gaseous supply device 155 supplies pressurized gas (fluid), which is supplied from the gas supply device 201 through the gas supply pipe 203, the tube carrier 29, and the supply pipe 241b, to the wafer stage WST through a supply pipe 270A. Further, the gaseous supply device 155 supplies a negative pressure, which is supplied from the vacuum absorption device 202 through the gas exhaust pipe 204, the tube carrier 29, and the vacuum pipe 241a, to the wafer stage WST through a vacuum pipe 270B.

Figure 4:
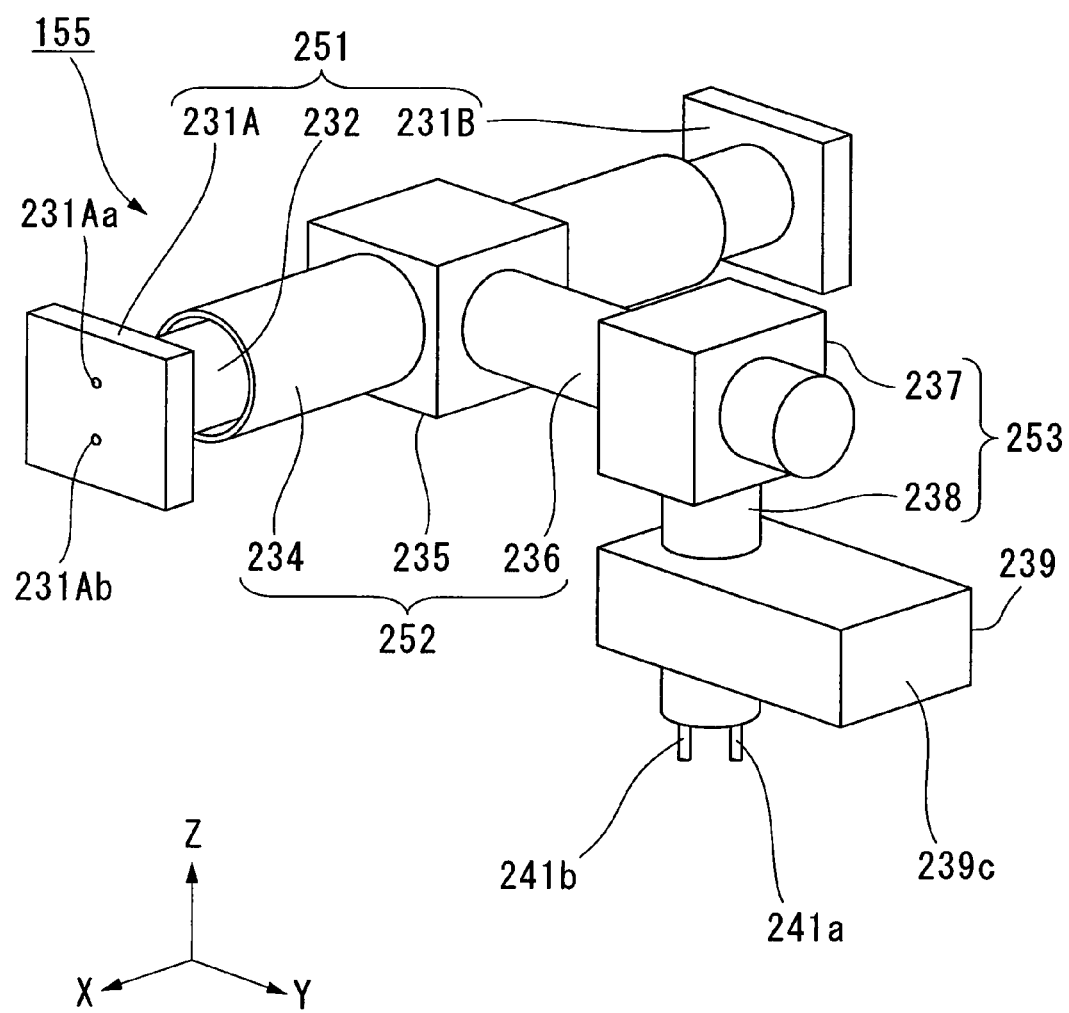
FIG. 4 is a perspective view showing the schematic configuration of a gaseous supply device.

The gaseous supply device 155 includes a first unit 251 that has a pair of plate-shaped fixed members 231A and 231B that are fixed to a side surface 26a on a +Y side of the wafer stage main body 26, and a columnar member 232, to which the fixed members 231A and 231B are fixed at both ends of a longitudinal direction thereof, with the X direction as the longitudinal direction, a second unit 252 that has a cylindrical member 234 movably attached in the X-axis direction to the circumference of the columnar member 232, and a third unit 253 and a Z support member 239 that are sequentially connected to the second unit 252, as shown in FIG. 4.

The second unit 252 has the cylindrical member 234, a mounting member 235 that is fixed outside a central portion in a longitudinal direction of the cylindrical member 234, and a columnar member 236 that is fixed to a +Y-side end surface of the mounting member 235 and extends in the Y direction. The cylindrical member 234 has an inner diameter slightly larger than an outer diameter of the columnar member 232, and the columnar member 232 is inserted into the cylindrical member 234 in a state where a predetermined clearance is formed over the entire circumference. For this reason, the columnar member 232 is relatively movable in the X-axis direction and the rotation direction around the X axis with respect to the cylindrical member 234.

The third unit 253 has a Y support member 237 that is provided on a circumference in the vicinity of a +Y side end of the columnar member 236 and has substantially a cube shape, and a columnar member 238 that is fixed along the Z-axis direction at a lower surface (−Z-side surface) of the Y support member 237. The columnar member 236 is inserted into the Y support member 237 in a state where a predetermined clearance is formed over the entire circumference. For this reason, the Y support member 237 supports the columnar member 236 to be movable in the Y-axis direction and around the Y axis.

The Z support member 239 has an exterior appearance of a substantially rectangular parallelepiped shape and is fixed to the −Y-side end surface of the tube carrier 29 at a +Y-side end surface 239c. The columnar member 238 is inserted into the Z support member 239 in a state where a predetermined clearance is formed over the entire circumference. For this reason, the Z support member 239 supports the columnar member 238 to be movable in the Z-axis direction and around the Z axis.

The gaseous supply device 155 has a fluid supply flow passage (not shown) that introduces pressurized gas, which is supplied from the gas supply device 201 through the gas supply pipe 203, the gas supply path in the tube carrier 29, and the supply pipe 241b, from a flow passage 231Aa formed in the fixed member 231A to the supply pipe 270A. The fluid supply flow passage is formed to sequentially connect the insides of the cylindrical member 238, the Y support member 237, the columnar member 236, the mounting member 235, the cylindrical member 234, and the columnar member 232. For this reason, pressurized gas that is supplied from the gas supply device 201 sequentially passes through the gas supply pipe 203, the gas supply path in the tube carrier 29, the supply pipe 241b, the liquid supply flow passage of the gaseous supply device 155, the flow passage 231Aa, and the supply pipe 270A, and is then introduced to the wafer stage WST as power.

A portion of pressurized gas in the liquid supply flow passage is discharged to a gap between the columnar member 238 and the Z support member 239, a gap between the Y support member 237 and the columnar member 236, and a gap between the cylindrical member 234 and the columnar member 232. Accordingly, the portion of pressured gas functions as a type of gas static pressure bearing by supporting the members forming the gap to be movable in the axial direction and the rotation direction around the axis in a non-contact manner with a static pressure (that is, by a pressure in the gap) of pressurized gas.

Meanwhile, the gaseous supply device 155 has a vacuumization flow passage (not shown) that supplies the negative pressure, which is supplied from the vacuum absorption device 202 through the gas exhaust pipe 204, the gas exhaust path in the tube carrier 29, and the vacuum pipe 241a, from a flow passage 231Ab formed in the fixed member 231A to the vacuum pipe 270B. The vacuumization flow passage is formed to sequentially connect the insides of the columnar member 238, the Y support member 237, the columnar member 236, the mounting member 235, the cylindrical member 234, and the columnar member 232. For this reason, the negative pressure that is supplied from the vacuum absorption device 202 sequentially passes through the gas exhaust pipe 204, the gas exhaust path in the tube carrier 29, the vacuum pipe 241a, the vacuumization flow passage of the gaseous supply device 155, the flow passage 231Ab, and the vacuum pipe 270B, and is then introduced to the wafer stage WST as power. The negative pressure introduced to the wafer stage WST is used for absorption of the wafer W by a lift pin CT or a wafer holder 40 described below.

A portion of the vacuumization flow passage is opened in a gap between the columnar member 238 and the Z support member 239, a gap between the Y support member 237 and the columnar member 236, and a gap between the cylindrical member 234 and the columnar member 232. Then, the flows of gas from the individual gaps toward the vacuumization flow passage occur. Pressurized gas supplied to the individual gaps is absorbed by the negative pressure due to the flows of gas, and then pressurized gas is rapidly delivered to the overall circumferential directions of the individual columnar members by the absorption force. Simultaneously, a predetermined amount of pressurized gas is constantly maintained in the individual gaps.

As such, pressurized gas and the negative pressure are supplied in a state where the wafer stage main body 26 (wafer stage WST) and the tube carrier 29 that are connected to each other by the gaseous supply device 155 are supported to be movable while having six-degrees of freedom (6 DOF) in the X-axis direction, the Y-axis direction, the Z-axis direction, the direction around the X axis, the direction around the Y axis, and the direction around the Z axis in a non-contact manner.

Moreover, the above-described gaseous supply device 155 is described in Japanese Patent Application No. 2004-168481 (corresponding PCT International Publication No. WO 2005/122242) filed earlier by the present applicant as a power supply device.

Next, the electrical supply device 100 will be described.

Figure 5:
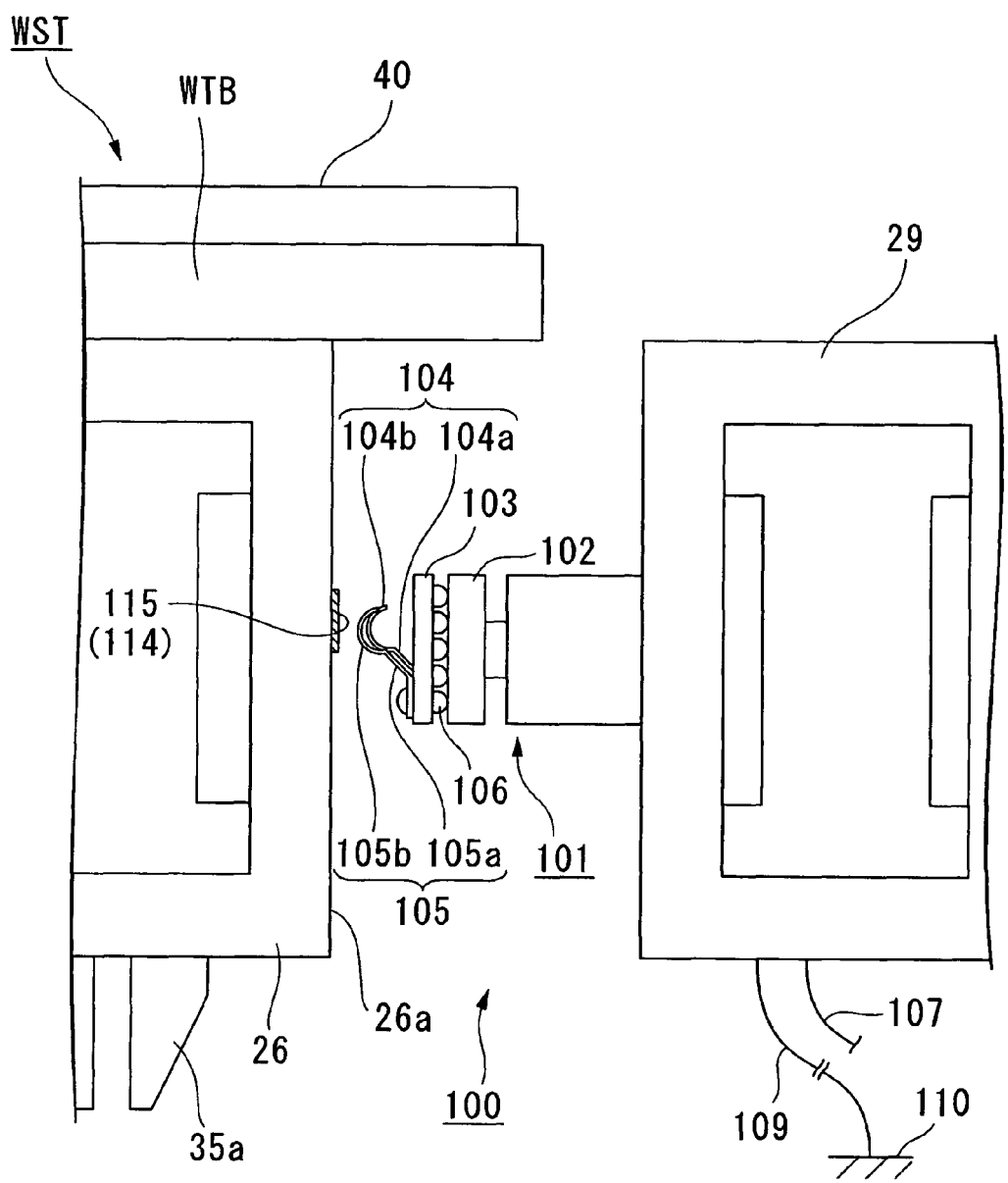
FIG. 5 is a front view of an electrical supply device that is provided in a tube carrier.
Figure 6:
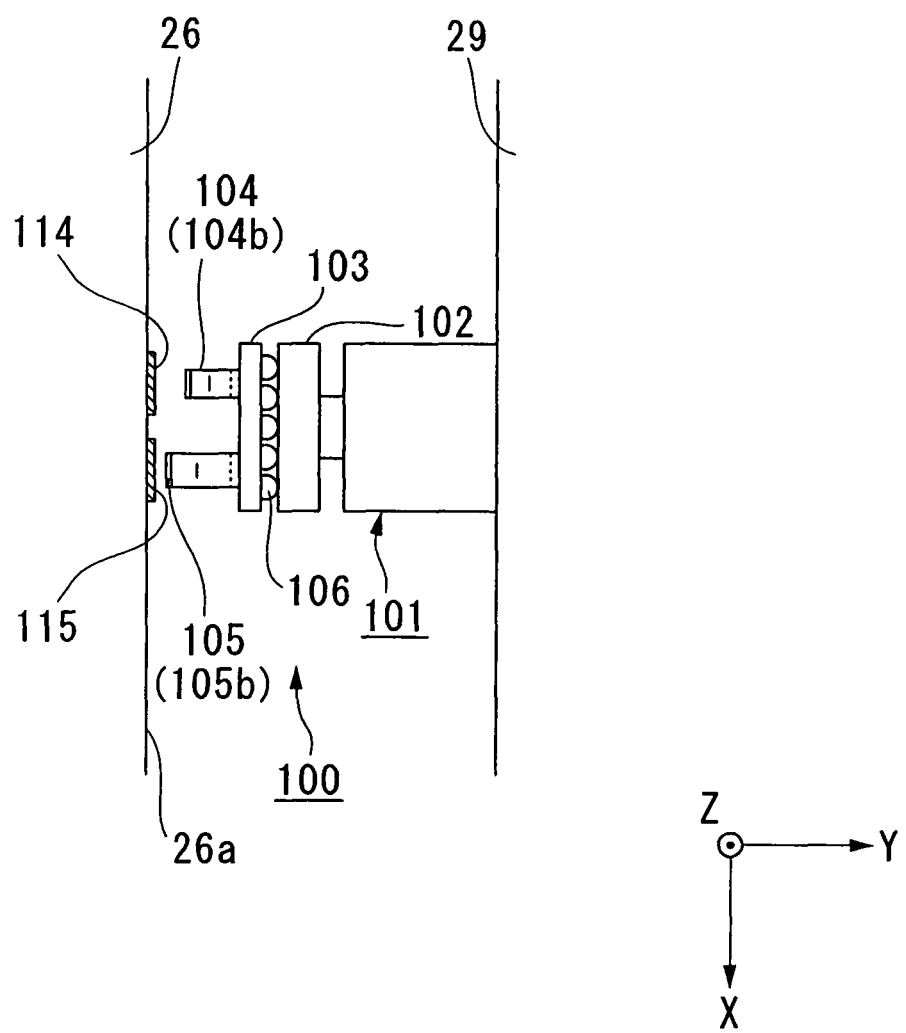
FIG. 6 is a plan view showing the details of essential parts of an electrical supply device.

FIG. 5 is a front view showing the electrical supply device 100 that is provided to face the side surface 26a on the +Y side of the wafer stage main body 26. FIG. 6 is a plan view showing the details of essential parts thereof. Moreover, in FIG. 5 and FIG. 6, for ease of understanding, the gaseous supply device 155 is not shown.

The electrical supply device 100 primarily includes a direct acting type actuator 101, such as an air cylinder or the like, a base portion 103 that is provided in a head portion 102 of the actuator 101, and a power supply element 104 and a grounding contact (contact) 105 that are provided in the base portion 103.

The actuator 101 is provided on a side surface of the −Y side of the tube carrier 29, and retreatably moves the plate-shaped head portion 102 parallel to an XZ plane along the Y-axis direction with respect to the wafer stage main body 26 under the control of the main control device 20. The base portion 103 is supported on the head portion 102 through a planar bearing (absorption mechanism) 106. The base portion 103 is configured to be movable within the XZ plane (within a plane substantially perpendicular to the Y-axis direction toward the wafer stage main body 26) with respect to the head portion 102 with a fine stroke.

The power supply element 104 is formed by bending a thin metal plate having conductivity. The power supply element 104 has a protruding piece 104a that obliquely extends from the base portion 103 toward the wafer stage main body 26 and a contact portion 104b that is formed at a front end of the protruding piece 104a to have a C shape. The protruding piece 104a and the contact portion 104b have flexibility and are provided to be elastically deformable in the Y-axis direction. As shown in FIG. 6, the contact 104b is disposed at a position facing a power supply electrical contact (second electrical contact) 114 provided at the side surface 26a of the wafer stage main body 26. The power supply electrical contact 114 is connected to a battery (not shown) that is mounted on the wafer stage main body 26, and electrical power as power is accumulated in the battery.

The power supply element 104 is connected to a power supply device 108 (not shown in FIGS. 5 and 6) (see FIG. 7), which is connected to the main control device 20, through a power supply line 107 connected to the tube carrier 29.

Like the power supply element 104, the grounding contact 105 is formed by bending a thin metal plate having conductivity. The grounding contact 105 has a protruding piece 105a that obliquely extends from the base portion 103 toward the wafer stage main body 26 and a contact portion 105b that is formed at a front end of the protruding piece 105a to have a C shape. The protruding piece 105a and the contact portion 105b have flexibility and are provided to be elastically deformable in the Y-axis direction. As shown in FIG. 6, the contact portion 105b is disposed at a position facing the grounding electrical contact (electrical contact) 115 provided at the side surface 26a of the wafer stage main body 26. The grounding contact 105 is connected to a ground portion (a portion having a potential 0V) 110 that is provided outside the stage apparatus ST through a ground line 109 connected to the tube carrier 29.

As shown in FIG. 6, the contact portion 105b of the grounding contact 105 is provided to protrude to the −Y side farther than the contact portion 104b of the power supply element 104. A distance between the grounding electrical contact 115 and the contact portion 105b is set to be shorter than a distance between the power supply electrical contact 114 and the contact portion 104b.

As such, in this embodiment, while the supply pipe, the vacuum pipe, and the cables, such as an electrical wiring line and the like, are connected to the tube carrier 29, no external cables and pipes (excluding the cables and pipes integrally fixed to the wafer stage WST, such as the supply pipe 270A, the vacuum 270B, and the like) are connected to the wafer stage WST (wafer stage main body 26). That is, the wafer stage WST is a cableless stage that does not have cables.

Figure 3A:
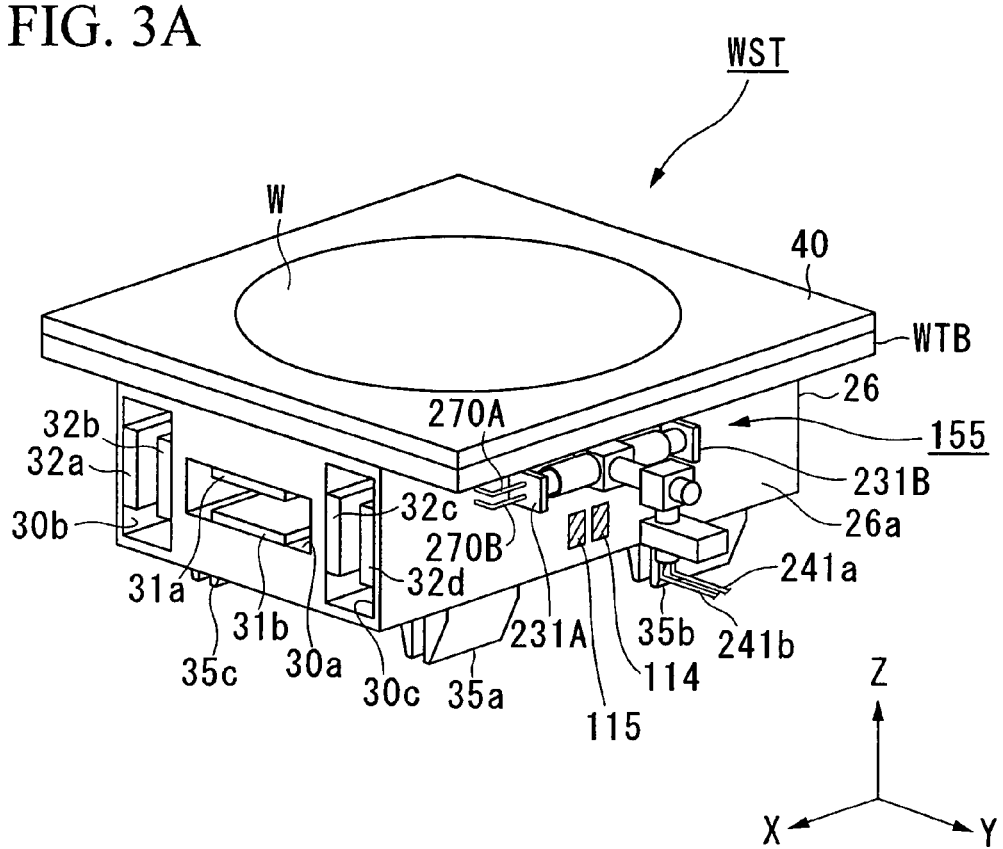
FIG. 3A is a perspective view illustrating a first driving system that is provided in a wafer stage.
Figure 3B:
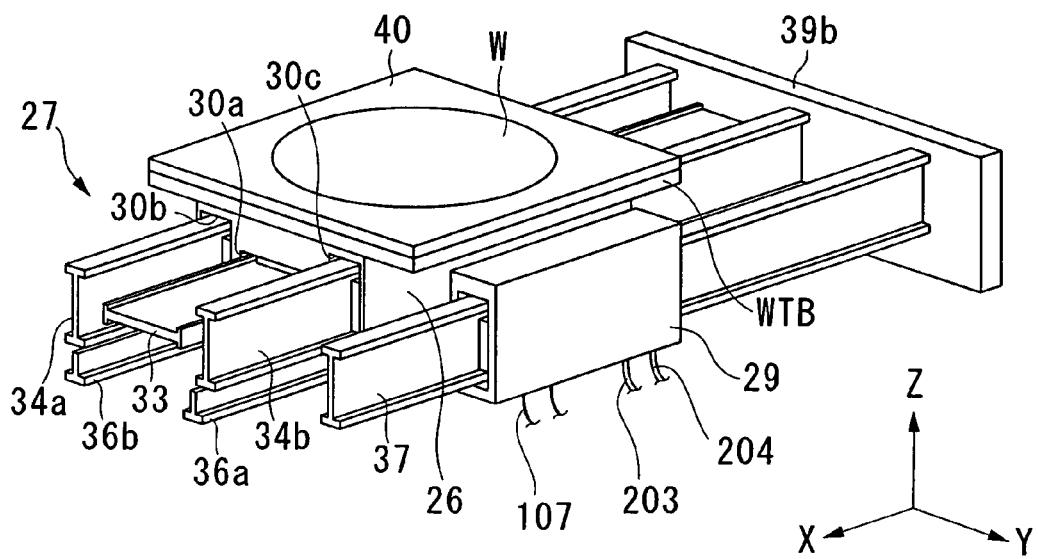
FIG. 3B is a perspective view illustrating a first driving system that is provided in a wafer stage.

FIGS. 3A and 3B are perspective views illustrating the first driving system 27 that is provided in the wafer stage WST. As shown in FIG. 3A, three openings 30a to 30c are provided at an end surface in the +X direction of the wafer stage main body 26, and three openings (not shown) are provided at an end surface in the −X direction of the wafer stage main body 26 to correspond to the openings 30a to 30c. A pair of permanent magnets 31a and 31b is provided at the opening 30a as a Y-axis movable element. Further, a pair of permanent magnets 32a and 32b is provided at the opening 30b as an X-axis movable element. Similarly, a pair of permanent magnets 32c and 32d is provided at the opening 30c as an X-axis movable element.

Meanwhile, as shown in FIG. 3B, a Y-axis stator 33 that includes a plurality of coils is provided to pass through the wafer stage main body 26 via the opening 30a in the X direction. Further, X-axis stators 34a and 34b, each including a plurality of coils, are provided to pass through the wafer stage main body 26 via the openings 30b and 30c in the X direction, respectively. The Y-axis stator 33 finely drives the wafer stage main body 26 in the Y direction in cooperation with the pair of permanent magnets 31a and 31b provided at the opening 30a.

The X-axis stators 34a and 34b drives the wafer stage main body 26 in the X direction with a long stroke in cooperation with the pair of permanent magnets 32a and 32b and the pair of permanent magnets 32c and 32d, respectively. In addition, the wafer stage main body 26 can be rotated in the θz direction by varying a Lorentz force generated by the pair of permanent magnets 32a and 32b and the X-axis stator 34a from a Lorentz force generated by the pair of permanent magnets 32c and 32d and the X-axis stator 34b. That is, the first driving system 27 has a moving magnet type linear motor having the X-axis stator 34a and the pair of permanent magnets 32a and 32b and a moving magnet type linear motor having the X-axis stator 34b and the pair of permanent magnets 32c and 32d. Moreover, although a case where the moving magnet type linear motors are provided has been described here, moving coil type linear motors may be provided. As described above, relative to the movement in the X direction, the wafer stage WST is a guideless stage, that is, no guide member for guiding the movement is provided.

As shown in FIG. 3A, four permanent magnets 35a to 35d (the permanent magnet 35d is not shown) are provided as Z-axis movable elements below the wafer stage main body 26. Further, as shown in FIG. 3B, a Z-axis stator 36a that includes a plurality of coils in correspondence with the permanent magnets 35a and 35b and extends in the X direction is provided, and a Z-axis stator 36b that includes a plurality of coils in correspondence with the permanent magnets 35c and 35d and extends in the X direction is provided. The Z-axis stators 36a and 36b generate a driving force to the Z direction in cooperation with the permanent magnets 35a and 35b and the permanent magnets 35c and 35d, respectively. The wafer stage main body 26 can be driven in the Z direction, the θx direction, and the θy direction by controlling a current, which is supplied to the coils provided in the Z-axis stators 36a and 36b. Further, in order to drive the tube carrier 29 in the X direction, a stator 37 that extends in the X direction is also provided. Moreover, both ends of each of the Y-axis stator 33, the X-axis stators 34a and 34b, the Z-axis stators 36a and 36b, and the stator 37 are fixed to stators 39a and 39b that constitute the second driving systems 28a and 28b, respectively.

Returning to FIG. 2, Y-axis stators 38a and 38b that constitute the second driving systems 28a and 28b and extend in the Y direction are provided above the protruding portions FCa and FCb of the frame caster FC, respectively. The Y-axis stators 38a and 38b are floatingly supported above the protruding portions FCa and FCb through a predetermined clearance by gas static pressure bearings (not shown) provided at the lower surfaces thereof, for example, air bearings. This is because the stators 38a and 38b move in a −Y direction as a Y counter mass of the Y direction due to a reaction force generated by the movement of the wafer stage WST or the measurement stage MST in the Y direction and cancel the reaction force according to a momentum conservation law.

The wafer stage main body 26 and the like that have been described with reference to FIGS. 3A and 3B are disposed between the stators 38a and 38b. The stators 39a and 39b that are fixed to both ends of each of the Y-axis stator 33, the X-axis stators 34a and 34b, the Z-axis stator 36a and 36b, and the stator 37 shown in FIG. 3B are inserted into the insides of the stators 38a and 38b, respectively. The stators 38a and 38b include permanent magnets that are arranged along the Y direction, and the stators 39a and 39b include coils that are arranged in the Y direction. That is, the second driving system 28a and 28b includes moving coil type linear motors that drive the wafer stage WST in the Y direction. Moreover, although a case where the moving coil type linear motors are provided has been described here, moving magnet type linear motors may be provided.

A wafer holder (holder) 40 that detachably holds the wafer W is provided on the wafer table WTB. The wafer holder 40 is formed of a conductive material, such as Si—SiC or the like. The wafer holder 40 includes a plate-shaped main body and an auxiliary plate that is fixed on an upper surface of the main body, has a circular opening formed at its central portion and larger than the diameter of the wafer W, and exhibits a liquid-repellent property (water-repellent property). The wafer holder 40 is electrically connected to the above-described grounding electrical contact 115 by a wiring line (not shown).

In a region of the main body inside the circular opening of the auxiliary plate, multiple (a plurality of) pins are arranged. The wafer W is vacuum-absorbed in a state where it is supported by the multiple pins. In this case, in a state where the wafer W is vacuum-absorbed, heights of the surface of the wafer W and the surface of the auxiliary plate are substantially the same. Moreover, the surface of the wafer table WTB may have a liquid-repellent property, without providing the auxiliary plate.

In the wafer stage WST, lift pins (center-up pins) CT (see FIG. 7) that pass through the wafer holder 40 and ascend and descend with electrical power of the above-described battery as a driving source is provided. The lift pins CT hold and release the absorption of the wafer W by the negative pressure supplied through the gaseous supply device 155. The ascending and descending operation of the lift pins CT and the absorption operation of the wafer W by the lift pins CT are controlled by the main control device 20.

As shown in FIG. 2, a reflecting surface 41X that is perpendicular to the X direction (extending in the Y direction) is formed at one end (+X-side end) in the X direction of the wafer table WTB by a mirror surface processing. Further, a reflecting surface 41Y that is perpendicular to the Y direction (extending in the X direction) is formed at one end (+Y-side end) in the Y direction thereof by a mirror surface processing. Interferometer beams (beams) from X-axis interferometers 42 and 43 and Y-axis interferometers 44 and 44a that constitute the interferometer system 24 (see FIG. 7) are projected onto the reflecting surfaces 41X and 41Y, respectively, and then the position in the X-axis direction and the position in the Y-axis direction of the wafer stage WST (that is, the wafer W) are measured. Moreover, the X-axis interferometers 42 and 43 and the Y-axis interferometers 44 and 44a shown in FIG. 2 are collectively shown as the interferometer 23 in FIG. 1.

The X-axis interferometer 42 can measure the position in the X direction of the wafer table WTB or the measurement stage MTB by each of the projection center position and the alignment center position in the Y direction. The Y-axis interferometer 44 has a measurement axis parallel to the Y axis. The Y-axis interferometer 44 mainly detects the position in the Y direction of the wafer table WTB and also detects the position in the Y direction of the measurement table MTB when the wafer stage WST is located at the loading position for replacing the wafer W. The X-axis interferometer 43 and the Y-axis interferometer 44a supplementarily detect the position of the wafer stage WST within the XY plane when the wafer stage WST is located at the loading position for replacing the wafer W.

The measurement stage MST substantially has the same configuration as the wafer stage WST, excluding the tube carrier 29, the gaseous supply device 155, and the electrical supply device 100. That is, as shown in FIG. 2, the measurement stage MST includes a measurement stage main body 46 that is disposed on the base plate 21 and a measurement table MTB that is mounted on the measurement stage main body 46. Further, the measurement stage MST includes a first driving system 47 that drives the measurement stage main body 46 in the X direction with a long stroke and finely drives the measurement stage main body 46 in the Y direction, the Z direction, the θx direction, the θy direction, and the θz direction, and second driving systems 48a and 48b that drive the measurement stage main body 46 and the first driving system 47 in the Y direction with a long stroke. The measurement stage main body 46 has a hollow member that has a rectangular frame shape in cross-section and extends in the X direction.

The measurement stage MST includes a group of meters that perform various measurements in respects to exposure.

The upper surface of the measurement table MTB has a liquid-repellent property (water-repellent property). A reflecting surface 50 that is perpendicular to the Y direction (extending in the X direction) is formed at one end (+Y side end) in the Y direction of the measurement table MTB by a mirror surface processing. In addition, a reflecting surface 51X that is perpendicular to the X direction (extending in the Y direction) is formed at one end (+X-side end) in the X direction of the measurement table MTB by a mirror surface processing, and a reflecting surface 51Y that is perpendicular to the Y direction (extending in the X direction) is similarly formed at one end (−Y-side end) in the Y direction of the measurement table MTB by a mirror surface processing. An interferometer beam (beam) from the Y-axis interferometer 44 that detects the position in the Y direction of the wafer stage WST is projected on the reflecting surface 50 when the wafer stage WST is located at the loading position for replacing the wafer W. Further, interferometer beams (beams) from the X-axis interferometer 42 and the Y-axis interferometer 52 that constitute the interferometer system 24 (see FIG. 7) are projected onto the reflecting surfaces 51X and 51Y, respectively. Then, the positions in the X-axis direction and the Y-axis direction of the measurement table MTB are measured. Like the Y-axis interferometer 44, the Y-axis interferometer 52 detects the position in the Y direction of the measurement table MTB excluding when the wafer stage WST is located at the loading position for replacing the wafer W. Moreover, the X-axis interferometer 42 and the Y-axis interferometer 52 shown in FIG. 2 are collectively shown as the interferometer 22 in FIG. 1.

Figure 7:
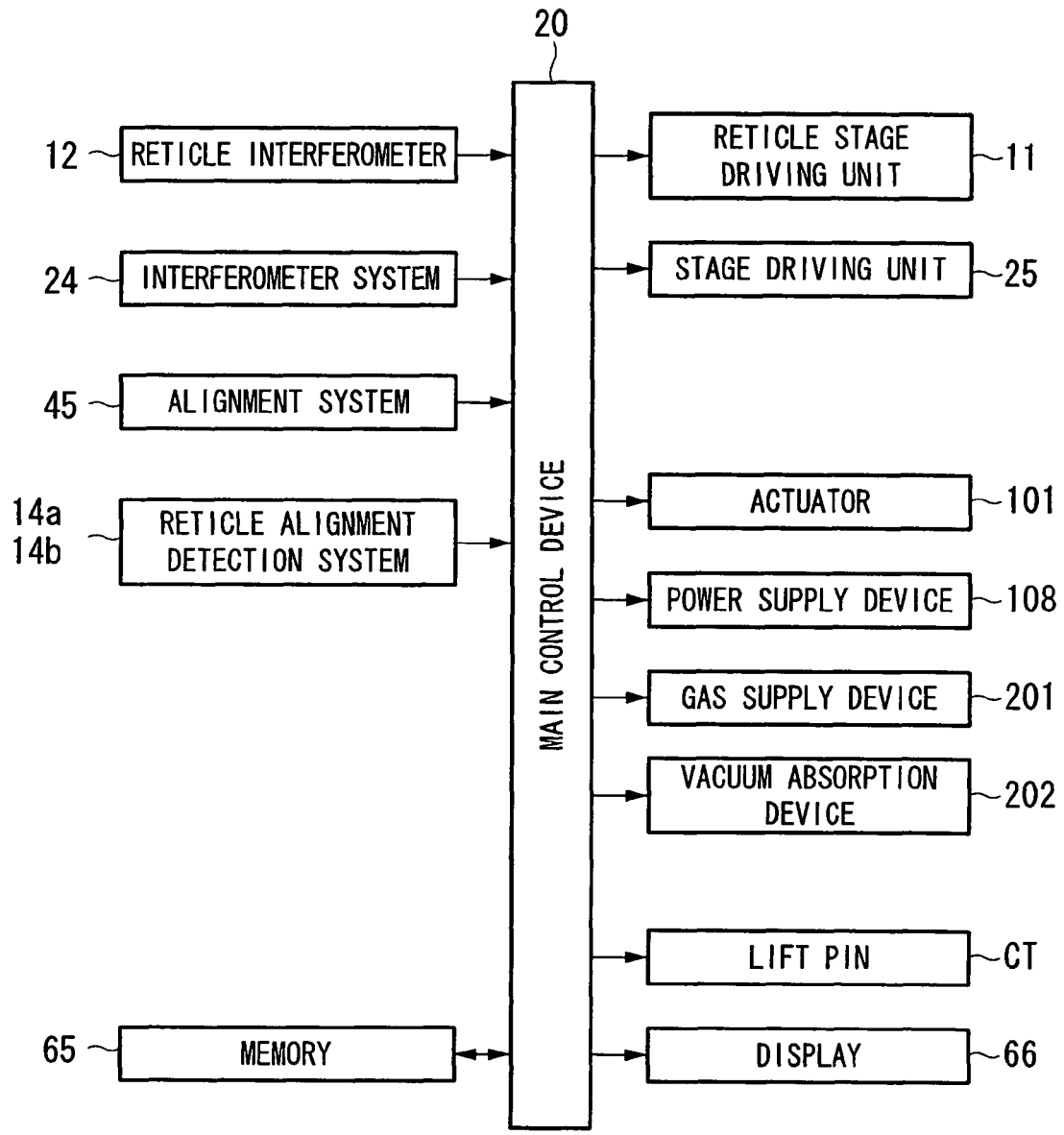
FIG. 7 is a block diagram showing the configuration of a control system of an exposure apparatus EX.

FIG. 7 is a block diagram showing the configuration of a control system of the exposure apparatus EX. The control system shown in FIG. 7 is emphasized on the main control device 20 that has a microcomputer (or a work station) for collectively controlling the overall operation of the exposure apparatus EX. Further, a memory 65 and a display 66, such as a CRT (Cathode Ray Tube) display (or a liquid crystal display), are connected to the main control device 20. The memory 65 stores information required for controlling the operation of the exposure apparatus EX, for example, a baseline, a shot arrangement obtained through an EGA (Enhance Global Alignment) operation, and a history of the exposure. Then, the display 66 displays various kinds of information, such as information indicating the status of the exposure apparatus EX output from the main control device 20 and error information.

Figure 8A:
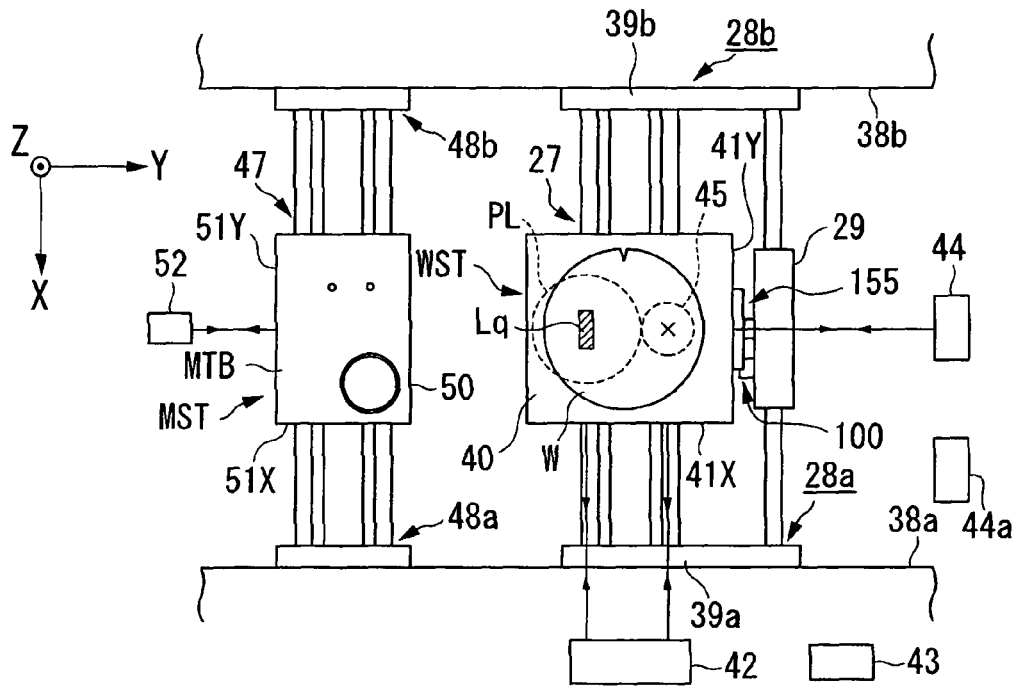
FIG. 8A is a plan view illustrating a parallel processing operation of a wafer stage and a measurement stage.
Figure 8B:
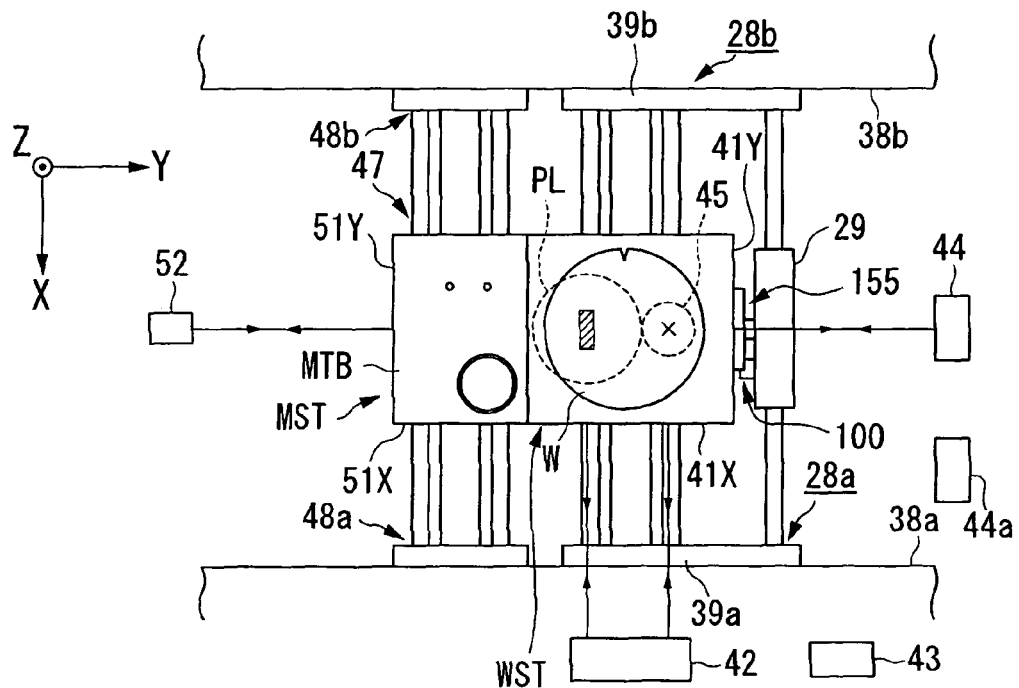
FIG. 8B is a plan view illustrating a parallel processing operation of a wafer stage and a measurement stage.
Figure 9:
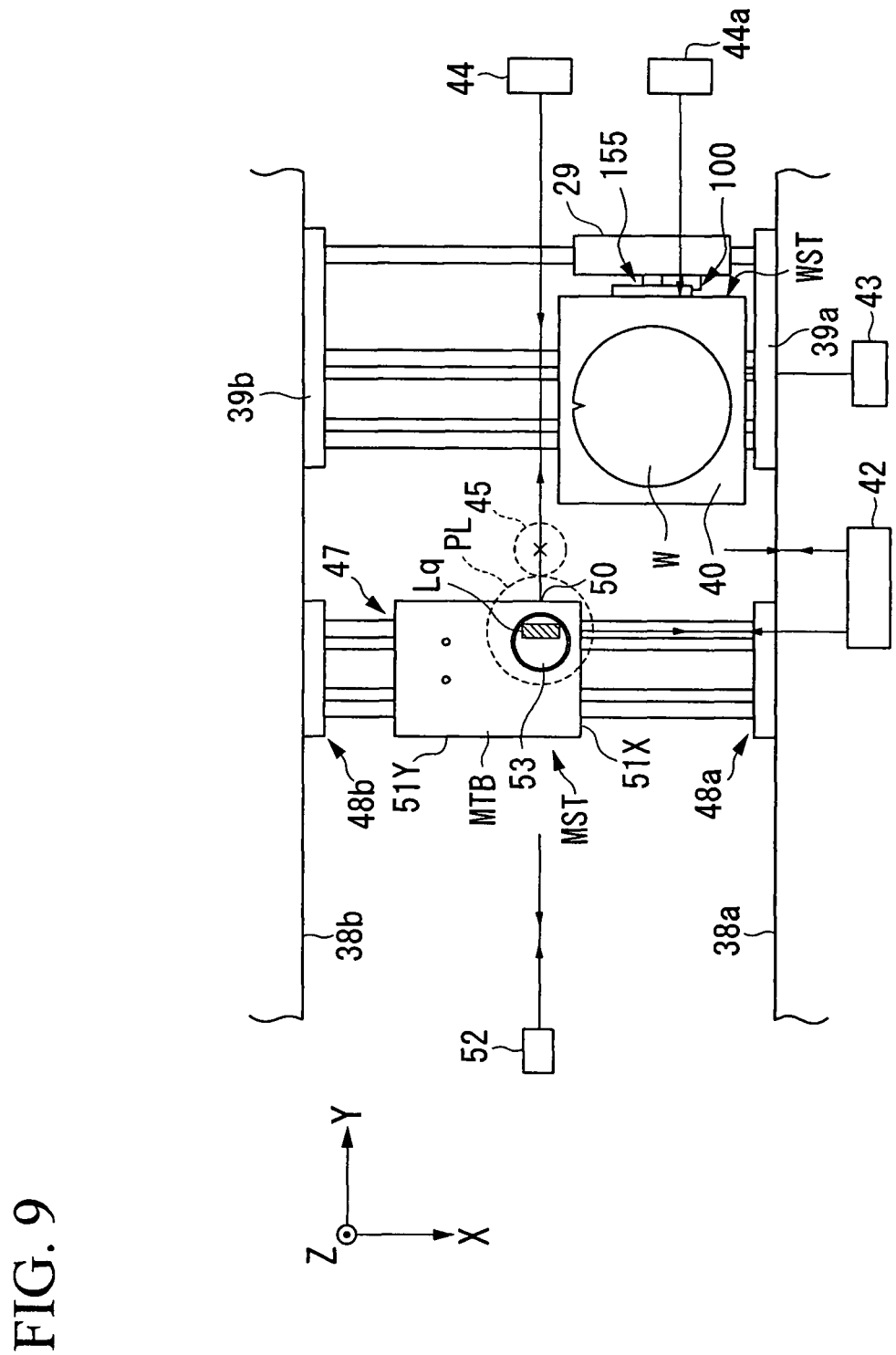
FIG. 9 is a plan view illustrating a parallel processing operation of a wafer stage and a measurement stage.
Figure 11:
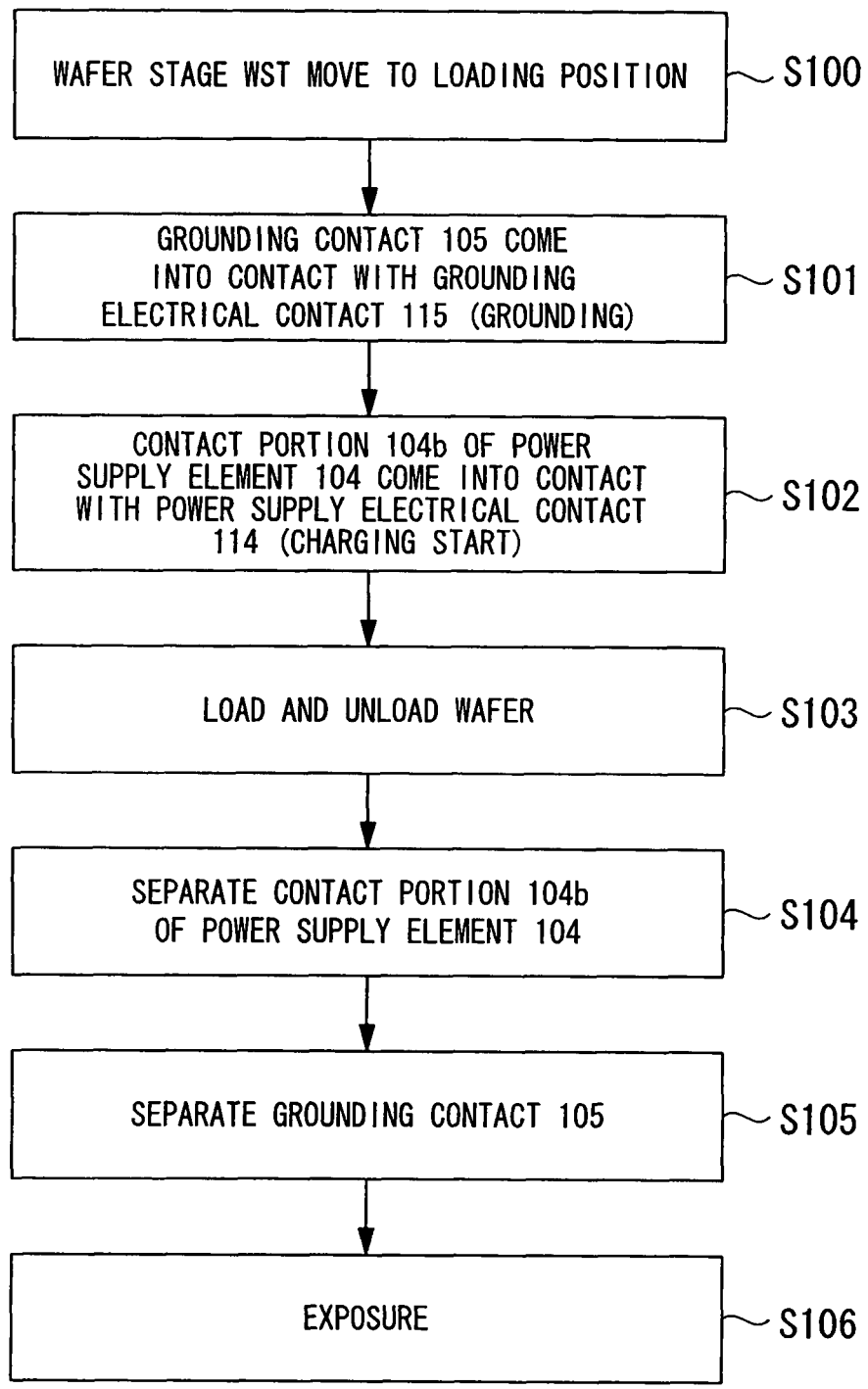
FIG. 11 is a flowchart showing an operation of an exposure apparatus.

Next, a parallel processing operation of the wafer stage WST and the measurement stage MST in the exposure apparatus EX having the above-described configuration will be described together with the grounding operation and the power supply operation of the wafer stage WST. FIGS. 8A, 8B, and 9 are plan views illustrating the parallel processing operation of the wafer stage WST and the measurement stage MST. Further, FIG. 11 is a flowchart illustrating the grounding operation and the power supply operation of the wafer stage WST.

FIG. 8A is a plan view showing a state where step-and-scan system exposure is performed on the wafer W that is held on the wafer stage WST (here, for example, the last wafer of one lot). As shown in FIG. 8A, the wafer stage WST is disposed below the projection optical system PL (−Z direction), and the measurement stage MST waits at a predetermined standby position in the −Y direction where it does not collide (contact) against the wafer stage WST. The main control device 20 performs the exposure operation on the wafer W by repetitively performing an inter-shot movement operation, in which the wafer stage WST is moved to a scanning start position (acceleration start position) in order to expose each shot region on the wafer W, and a scanning exposure operation that transfers the pattern formed in the reticle R onto each shot region by a scanning exposure method on the basis of the result of wafer alignment, such as enhanced global alignment (EGA), which is performed in advance, and the latest baseline measurement result of the alignment system 45.

Moreover, the battery that is mounted on the wafer stage WST is charged with electrical power in advance before the exposure operation. Further, in the electrical supply device 100, as shown in FIG. 6, the actuator 101 is set in a retreat state. Accordingly, the power supply element 104 and the power supply electrical contact 114 are separated from each other. Further, in a state where the grounding contact 105 and the grounding electrical contact 115 are separated from each other, the inter-shot movement operation and the scanning exposure operation are performed.

Here, the inter-shot movement operation, in which the wafer stage WST is moved, is performed by allowing the main control device 20 to control driving of the first driving system 27 and the second driving systems 28a and 28b provided in the wafer stage WST while monitoring the detection values of the X-axis interferometer 42 and the Y-axis interferometer 44. Further, the scanning exposure is implemented in the following manner. That is, the main control device 20 controls driving of the reticle driving unit 11, the first driving system 27, and the second driving systems 28a and 28b while monitoring the detection values of the X-axis interferometer 42, the Y-axis interferometer 44, and the reticle interferometer 12. Then, the main control device 20 relatively scans the reticle R (reticle stage RST) and the wafer W (wafer stage WST) relative to the Y direction and uniformly and synchronously moves the reticle R (reticle stage RST) and the wafer W (wafer stage WST) to the illumination region of illumination light IL relative to the Y direction after acceleration ends during scanning and immediately before deceleration starts. Moreover, the exposure operation is performed in a state where water Lq is held in the space between the front lens GL and the wafer W.

In the inter-shot movement operation and the scanning exposure operation, the wafer W is absorbed and held to the wafer holder 40 by the negative pressure that is supplied from the vacuum absorption device 202 through the gaseous supply device 155. Further, during the inter-shot movement operation, since the tube carrier 29 uniformly moves in the X-axis direction, there is a section where it does not precisely follow the wafer stage WST, which is accelerated and decelerated. However, since the cylindrical member 234 supports the columnar member 232 to be movable in the X-axis direction in a non-contact manner, a force from the gaseous supply device 155 is not applied to the wafer stage WST. Similarly, even though the wafer stage WST is driven in the X-axis direction or the Z-axis direction (additionally, and the direction around the X-axis, the direction around the Y-axis, and the direction around the Z-axis), a force from the gaseous supply device 155, such as tension or the like, is not applied to the wafer stage WST.

If exposure on the wafer W held on the wafer stage WST ends, the main control device 20 controls driving of the first driving system 47 and the second driving systems 48a and 48b provided in the measurement stage MST on the basis of the detection value of the Y-axis interferometer 52, thereby moving the measurement stage MST (measurement table MTB) to a position shown in FIG. 8B. FIG. 8B is a diagram showing a state where the +Y-side surface of the measurement table MTB and the −Y-side surface of the wafer holder 40 (auxiliary plate) come into contact with each other. Moreover, in the examples shown in FIGS. 8A and 8B, the position of the measurement stage MST in the X direction is not detected until the measurement table MTB and the wafer holder (auxiliary plate) come into contact with each other. However, it is preferable to provide an auxiliary laser interferometer that detects the position of the measurement table MTB in the X direction at that time. Further, although a case where the +Y-side surface of the measurement table MTB and the −Y-side surface of the wafer holder (auxiliary plate) come into contact with each other has been described, the measurement values of the interferometers 44 and 52 may be monitored, and the measurement table MTB and the wafer table WTB may be spaced apart from each other, for example, at approximately 300 μm (a gap small enough to prevent leakage of water by surface tension) in the Y direction.

Next, the main control device 20 starts an operation for driving both stages WST and MST in the +Y direction while keeping positional relationship between the wafer table WTB and the measurement table MTB in the Y direction. In such a manner, if the wafer stage WST and the measurement stage MST are driven simultaneously by the main control device 20, in the state of FIG. 8B, water Lq that is held in the space between the front lens GL provided in the projection unit PU and the wafer W sequentially moves on the wafer W, the wafer holder 40, and the measurement table MTB according to the movement of the wafer stage WST and the measurement stage MST in the +Y direction. Moreover, during the movement, the positional relationship between the wafer table WTB and the measurement table MTB that come into contact with each other is maintained.

Next, the main control device 20 controls driving of the first driving system 27 and the second driving systems 28a and 28b provided in the wafer stage WST while managing the position of the wafer stage WST on the basis of the detection values of the X-axis interferometer 43 and the Y-axis interferometer 44a. Then, the main control device 20 moves the wafer stage WST to a predetermined loading position (article replacement position) shown in FIG. 9 (Step S100; see FIG. 11), and performs a predetermined measurement using the measurement stage MST, in which water is held in the space between the measurement stage MST and the front lens GL, as occasion demands. As the measurement, for example, the measurement of the baseline of the alignment system 45 that is performed after the reticle on the reticle stage RST is replaced can be exemplified. Moreover, the loading position may be set on the −X side of FIG. 9.

Figure 10A:
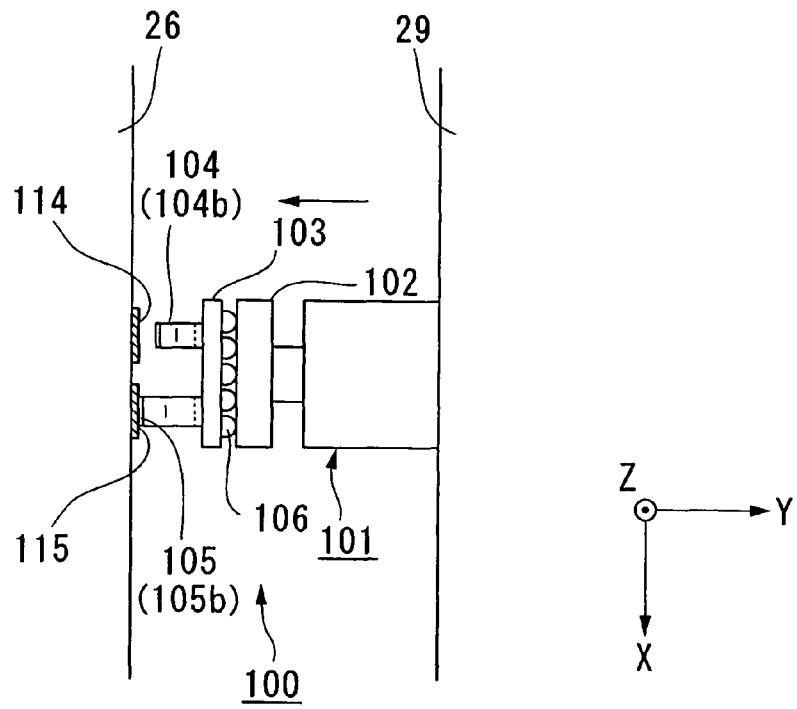
FIG. 10A is a diagram showing an operation of an electrical supply device.
Figure 10B:
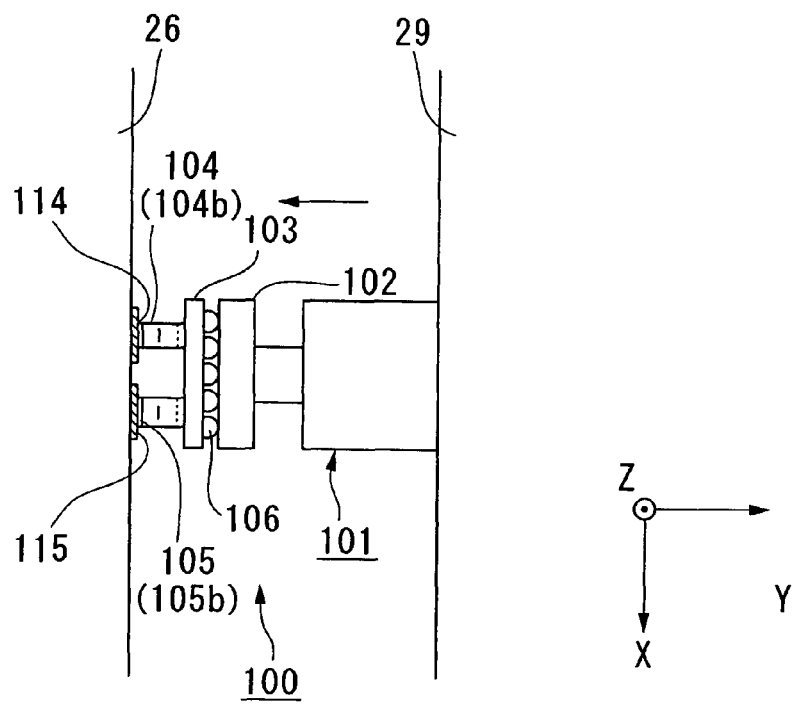
FIG. 10B is a diagram showing an operation of an electrical supply device.

The replacement of the first wafer of the next lot is performed relative to the wafer stage WST at the loading position, but the main control device 20 drives the actuator 101 and moves the head portion 102 forward toward the wafer stage WST (wafer stage main body 26) before the wafer W is separated from the wafer holder 40 using the lift pin CT. At this time, in the electrical supply device 100, since the contact portion 105b of the grounding contact 105 protrudes farther than the contact portion 104b of the power supply element 104, as shown in FIG. 10A, the grounding contact 105 comes into contact with the grounding electrical contact 115 before the contact portion 104b of the power supply element 104 comes into contact with the power supply electrical contact 114 (Step S01). Accordingly, the wafer stage main body 26 or the wafer holder 40 is grounded. Then, even though the wafer stage main body 26 or the wafer holder 40 is charged, static electricity is discharged from the grounding contact 105 to the ground portion 110 through the ground line 109.

If the head portion 102 further moves forward, since the contact portion 104b of the power supply element 104 comes into contact with the power supply electrical contact 114, the battery can be charged with electrical power from the power supply device 108 through the power supply line 107 (Step S102). At this time, only an elastic deformation amount of the grounding contact 105 increases, and the contact with the grounding electrical contact 115 (that is, a state where the static electricity is discharged) is maintained.

Here, when the power supply element 104 and the grounding contact 105 come into contact with the power supply electrical contact 114 and the grounding electrical contact 115, respectively, a load is applied to the wafer stage main body 26. However, a load in the Y-axis direction applied to the wafer stage main body 26 is absorbed by elastic deformation of the power supply element 104 and the grounding contact 105. Further, loads in the X-axis direction and the Z-axis direction applied to the wafer stage main body 26 are absorbed by the movement of the base portion 103, which supports the power supply element 104 and the grounding contact 105, within the XZ plane with respect to the head portion 102 of the actuator 101 by the planar bearing 106.

In such a manner, after the wafer stage WST and the wafer holder 40 are grounded, the absorption of the wafer to the wafer holder 40 is released. Simultaneously the lift pins CT ascend in a state where the absorption of the wafer W is held, and the wafer W is separated from the wafer holder 40. Then, the wafer W held on the lift pins CT is unloaded to a wafer loader (not shown) (Step S1103).

When the wafer W is separated from the wafer holder 40, so-called separation charging may occur. However, since the wafer holder 40 having conductivity is connected to the grounding electrical contact 115 through the electrical wiring line and then grounded, the static electricity due to separation charging can be immediately discharged to the ground portion 110.

Thereafter, if the first wafer of the next lot is loaded to the lift pins CT, the lift pins CT descend and, if the wafer is placed on the wafer holder, the absorption is released. Simultaneously, the absorption to the wafer holder 40 starts (Step S103). Further, in a case where the static electricity is generated when a new wafer is set on the wafer holder 40, the static electricity can be discharged to the ground portion 110 through the grounding contact 105. Then, if the replacement of the wafer is completed and charging of the battery is completed, the main control device 20 retreats the actuator 101, and separates the power supply element 104 and the grounding contact 105 from the power supply electrical contact 114 and the grounding electrical contact 115, respectively (Steps S104 and S105).

Thereafter, in a reverse manner, the main control device 20 drives the wafer stage WST and the measurement stage MST in the −Y direction simultaneously while keeping the positional relationship of the Y direction between the wafer stage WST and the measurement stage MST. Then, the wafer stage WST (wafer W) is moved below the projection optical system PL, and the measurement stage MST is retreated to a predetermined position. Next, the main control device 20 executes a step-and-scan system exposure operation on the new wafer W in the same manner as described above, and sequentially transfers the reticle pattern to a plurality of shot regions on the wafer (Step S106).

As described above, in this embodiment, when the wafer stage WST is located at the wafer replacement position, the electrical supply device 100 supplies electrical power to the wafer stage WST and grounds the wafer stage WST, such that the static electricity can be discharged. Accordingly, an adverse effect on devices attached to the stage due to discharge of the static electricity and a damage of the pattern formed in the wafer can be prevented while suppressing vibration due to the connection of the electrical wiring lines to thereby prevent degradation of a transfer precision of the pattern. In particular, in case of a liquid immersion type exposure apparatus in this embodiment, since the static electricity is easily generated between the liquid and the substrate during the scanning exposure, it is necessary to discharge the static electricity and prevent the above-described problems. Further, in this embodiment, before the power supply element 104 comes into contact with the power supply electrical contact 114, the grounding contact 105 comes into contact with the grounding electrical contact 115. Accordingly, the occurrence of a short-circuit when electrical power is supplied to the wafer stage WST can be prevented, and the attached devices or the pattern formed in the wafer can be prevented from being damaged.

In this embodiment, since the electrical supply device 100 is provided in the tube carrier 29 that moves according to the movement of the wafer stage WST, the power supply and grounding of the wafer stage WST can be rapidly performed in a short time, and throughput can be improved. In addition, in this embodiment, the gaseous supply device 155 that supplies air power to the wafer stage WST in a non-contact manner is provided. Accordingly, the wafer stage WST can be implemented as a cableless stage that does not have cables, such as electrical wiring lines or air tubes. In addition, disturbance, such as vibration or the like, can be suppressed, and the transfer precision of the pattern can be improved.

In this embodiment, even though a load is applied to the wafer stage WST by friction or the like when the power supply element 104 and the grounding contact 105 come into contact with the power supply electrical contact 114 and the grounding electrical contact 115, respectively, the load is absorbed by the movement of the base portion 103 within the XZ plane through the planar bearing 106. Accordingly, the occurrence of a positioning error in the wafer stage WST can be suppressed. In addition, in this embodiment, the grounding contact 105 comes into contact with the grounding electrical contact 115 to reach a grounded state before the wafer is separated from the wafer holder 40. Accordingly, when separation charging by the separation of the wafer occurs, the static electricity can be immediately discharged. In particular, in this embodiment, since the wafer holder 40 is formed of a conductive material, even when the wafer holder 40 is charged, the static electricity can be smoothly excluded.

Although the preferred embodiments of the invention have been described with reference to the accompanying drawings, the invention is not limited to the embodiments. The shapes or the combinations of the individual components described in the above-described embodiments are just an example. Various modifications can be made without departing from the subject matter of the invention on the basis of design demands or the like.

For example, although the wafer stage WST is grounded when the wafer stage WST is located at the wafer replacement position in the above-described embodiments, the invention is not limited thereto. The grounding contact 105 may come into contact with the grounding electrical contact 115 to reach a grounded state when the wafer stage WST is located at an exposure position (or in the vicinity of the exposure position) after a predetermined time, at which charging may occur, lapses. Further, although the electrical supply device 100 is provided in the tube carrier 29 in the above embodiments, the invention is not limited thereto. For example, the electrical supply device 100 may be provided in the vicinity of the wafer replacement position of the projection unit PU or a body that supports the reticle stage or may be provided in the base plate 21 in the vicinity of the wafer replacement position. Further, when a counter mass that cancels the reaction force when the wafer stage WST moves in the X direction is provided in the vicinity of the wafer stage WST, the electrical supply device may be provided in the counter mass. In this case, light-weight of the tube carrier 29 can be realized, heat when the tube carrier 29 is driven can be reduced, and a disturbance factor, such as air fluctuation or the like, can be suppressed.

In the above embodiments, the wafer stage WST is grounded. Alternatively, the measurement stage MST may be grounded or the reticle stage RST may be grounded.

Moreover, the materials in the above embodiments (Si—SiC of the wafer holder 40 and ceramics of the wafer stage WST) are examples, but other materials may be used. Further, although the base portion 103 that supports the power supply element 104 and the grounding contact 105 is movable two-dimensionally by the planar bearing in the above embodiments, the base portion 103 may be movable by a roller or the like. In addition, the wafer stage WST of this embodiment is implemented as a cableless stage, but it may be implemented as a cabled stage (a stage, to which cables are connected).

The invention is not limited to the embodiments, but it may be applied to an exposure apparatus that does not use a liquid immersion method. Further, in the above embodiments, a case where ArF excimer laser light is used has been described. Alternatively, g-line (436 nm wavelength), i-line (365 nm wavelength), KrF excimer laser light (248 nm wavelength), $F_2$ laser light (157 nm wavelength), $Kr_2$ laser light (146 nm wavelength), YAG laser light, or harmonics of a semiconductor laser may be used.

Further, the invention can be applied to a twin-stage type exposure apparatus in which a plurality of wafer stages is provided. The structure and exposure operation of the twin-stage type exposure apparatus are disclosed, for example, in Japanese Patent Application, Publication Nos. H10-163099 and H10-214783 (corresponding U.S. Pat. Nos. 6,341,007, 6,400,441, 6,549,269, and 6,590,634), Published Japanese Translation No. 2000-505958 of PCT International Application (corresponding U.S. Pat. No. 5,969,441), or U.S. Pat. No. 6,208,407. In addition, the invention can also be applied to a wafer stage disclosed in Japanese Patent Application No. 2004-168481 (corresponding PCT International Publication No. WO 2005/122242) filed earlier by the present applicant.

Moreover, as the substrate that is held on the movable stage in each of the embodiments, in addition to a semiconductor wafer for manufacturing a semiconductor device, a glass substrate for a display device, a ceramic wafer for a thin film magnetic head, and a negative plate of a mask or reticle (synthesized quartz or silicon wafer) to be used in the exposure apparatus, or the like is applied. As the exposure apparatus EX, a scanning type exposure apparatus that does not use the liquid immersion method or a step-and-repeat system projection exposure apparatus (stepper) that exposes the complete pattern of the reticle R in a state where the reticle R and the wafer W are stationary and sequentially steps the wafer W may be also applied. In addition, the invention can be applied to a step-and-stitch system exposure apparatus that partially and superposingly transfers at least two patterns onto the wafer W. The types of the exposure apparatus EX are not limited to an exposure apparatus for manufacturing a semiconductor device that exposes a semiconductor device pattern to the wafer W. For example, an exposure apparatus for manufacturing a liquid crystal display element or a display, or an exposure apparatus for manufacturing a thin film magnetic head, a charge-coupled device (CCD), or a reticle or a mask can be considered.

If a linear motor is used in the wafer stage WST or the reticle stage RST (see U.S. Pat. No. 5,623,853 or U.S. Pat. No. 5,528,118), either an air levitation type that uses an air bearing or a magnetic levitation type that uses the Lorentz force or reactance force may be used. Further, each of the stages WST and RST may be a type that moves along a guide or a guideless type that no guide is provided. For the driving mechanism of each of the stages WST and RST, a planar motor may be used that faces a magnet unit having magnets disposed two-dimensionally to an armature unit having coils disposed two-dimensionally, and drives each of the stages WST and RST by an electromagnetic force. In this case, either the magnet unit or the armature unit may be connected to the stage WST or RST and the other one may be provided on the moving plane side of the stage WST or RST.

The reaction force generated by the movement of the wafer stage WST may be mechanically discharged to the floor (ground) using a frame member so as not to be delivered to the projection optical system PL, as described in Japanese Patent Application, Publication No. H08-166475 (corresponding U.S. Pat. No. 5,528,118). The reaction force generated by the movement of the reticle stage RST may be mechanically discharged to the floor (ground) using a frame member so as not to be delivered to the projection optical system PL, as described in Japanese Patent Application, Publication No. H08-330224 (corresponding U.S. Pat. No. 5,874,820).

As described above, the exposure apparatus EX of this embodiment is manufactured by assembling various subsystems, including each component, such that prescribed mechanical precision, electrical precision, and optical precision are maintained. In order to ensure various kinds of precision, adjustments are performed before and after assembling, including an adjustment to achieve optical precision for various optical systems, an adjustment to achieve mechanical precision for various mechanical systems, and an adjustment to achieve electrical precision for various electrical systems. The assembling process of the exposure apparatus from various subsystems includes, for example, the mutual mechanical connection, the wiring connection of electrical circuits, and the piping connection of the atmospheric pressure circuit of various subsystems. Of course, before the assembling process of the exposure apparatus from various subsystems, there are also the assembling processes of assembling the individual subsystems. When the assembling process of the exposure apparatus from various subsystems is finished, a comprehensive adjustment is performed to ensure various precisions of the exposure apparatus as a whole. Further, it is preferable to manufacture the exposure apparatus in a clean room in which, for example, the temperature and the cleanliness level are controlled.

Figure 12:
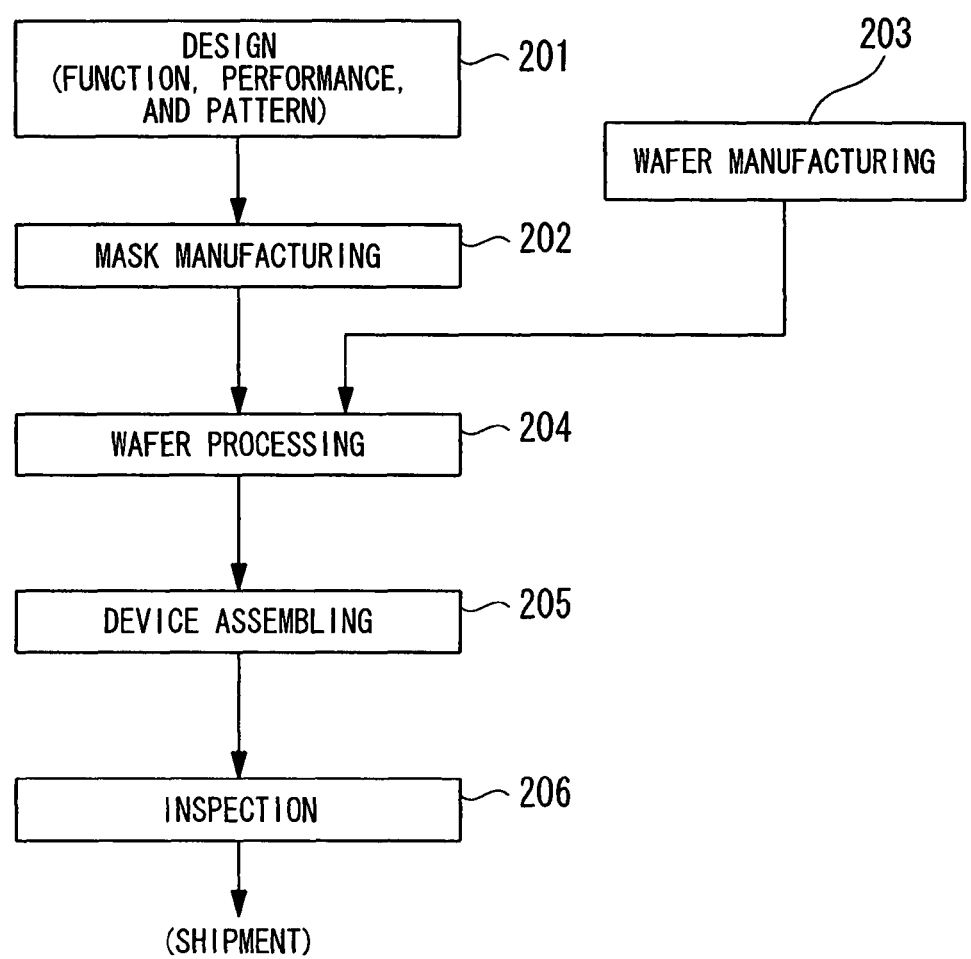
FIG. 12 is a flowchart showing an example of a manufacturing process of a semiconductor device.

FIG. 12 is a flowchart showing an example of a manufacturing process of a microdevice (a semiconductor chip, such as an IC or an LSI, a liquid crystal panel, a CCD, a thin film magnetic head, a micromachine or the like). As shown in FIG. 12, the microdevice, such as a semiconductor device or the like, is manufactured through a step of performing function/performance design of the microdevice (Step 201), a step of manufacturing a mask (reticle) based on the design step (Step 202), a step of manufacturing a substrate (wafer) that is a base substance of the device (Step 203), a step including a processing of transferring the pattern of the mask to the substrate using the exposure apparatus EX of the above embodiment (Step 204), a device assembling step (including dicing, bonding, and packaging) (Step 205), and an inspection step (Step 206).

The invention claimed is:

1. An exposure apparatus that exposes a photoresist coated substrate with illumination light via a projection optical system, the apparatus comprising:
   a first stage arranged on a base member and having a holder which holds the photoresist coated substrate;
   a movable member arranged on the base member and movable relative to the first stage;
   a driving system having a motor that moves the first stage and the movable member on the base member such that the first stage and the movable member come close to each other;
   a power supply member having a first portion that is provided on the first stage and a second portion that is provided on the movable member and to be electrically in contact with the first portion; and
   a controller configured to control the driving system and the power supply member,
   wherein the controller configured to control the driving system and the power supply member such that the first and second portions are electrically connected to each other to allow at least one of an electric power supply for the first stage and an electrical ground of the first stage when an exposing photoresist coated substrate with the illumination light is not performed.

2. The apparatus according to claim 1, wherein
   the at least one of the electrical power supply and the electric ground is performed in a different process when the exposing the photoresist coated substrate with the illumination light is not performed, different from an exposure process for the photoresist coated substrate with the illumination light.

3. The apparatus according to claim 2, wherein the different process includes an exchange process of the photoresist coated substrate that is held by the holder on the first stage with another photoresist substrate.

4. The apparatus according to claim 2, wherein
   the first stage has a battery,
   the first portion has a power supply electrical contact that is connected to the battery, and
   the power supply electrical contact of the first portion and a power supply electrical contact of the second portion are arranged to be in contact with each other in order to supply electric power to the battery.

5. The apparatus according to claim 4, wherein the first stage has a support member that is arranged to support the photoresist coated substrate and to be driven with electric power from the battery such that the support member is moved relative to the holder.

6. The apparatus according to claim 5, wherein
   the first portion has a grounding contact that is electrically connected to the holder, and
   the grounding contact of the first portion and a grounding contact of the second portion are arranged to be in contact with each other in order to ground the holder.

7. The apparatus according to claim 6, wherein the grounding contact of the second portion is arranged to be connected, via a line connected to the movable member, to an external ground portion.

8. The apparatus according to claim 7, further comprising:
   a gas supply member, different from the power supply member, and a part of which is provided on the first stage, wherein
   the gas supply member is arranged to supply at least one of negative pressure and positive pressure to the first stage while the first stage is not physically in contact with the movable member.

9. The apparatus according to claim 8, wherein the negative pressure is utilized for absorbing the photoresist coated substrate by at least one of the holder and the support member.

10. The apparatus according to claim 9, wherein the movable member is further arranged to be connected to another line for an electric supply, and a tube for the negative pressure.

11. The apparatus according to claim 10, wherein
    the projection optical system has a plurality of lenses including a lens that is arranged at a closest position to an image plane,
    the apparatus further comprising:
    a nozzle member arranged adjacent to the lens to supply liquid between the lens and a portion of a surface of the photoresist coated substrate held by the holder on the first stage; and
    a second stage arranged on the base member, that is movable relative to the first stage, wherein
    the controller is configured to control the driving system, to execute a relative movement between the first stage and the second stage, while the first stage is arranged opposite to the lens, such that the first and second stages come close to each other, and to move the first and second stages while the first and second stages are positioned adjacent to each other relative to the lens in a predetermined direction orthogonal to an optical axis of the lens so that the second stage is arranged opposite to the lens in place of the first stage while the liquid is substantially maintained between the lens and the portion of the surface of the photoresist coated substrate.

12. A device fabricating method comprising:
exposing a photoresist coated substrate with illumination light via a projection optical system using the exposure apparatus according to claim 1; and
developing the exposed substrate.

13. The apparatus according to claim 1, wherein
the power supply member includes an actuator that is configured to move the second portion, and
the controller is configured to control the actuator so that the second portion is electrically in contact with the first portion when the exposing the photoresist coated substrate with the illumination light is not performed.

14. A method of exposing a photoresist coated substrate with illumination light via a projection optical system, the method comprising:
moving a first stage having a holder which holds the photoresist coated substrate and a movable member movable relative to the first stage by a motor on a base member arranged below the projection optical system such that the first stage and the movable member come close to each other; and
electrically connecting first and second portions of a power supply member to each other to allow at least one of an electric power supply for the first stage and an electrical ground of the first stage when an exposing the photoresist coated substrate with the illumination light is not performed,
wherein the first portion is provided on the first stage, the second portion is provided on the movable member and to be electrically in contact with the first portion.

15. The method according to claim 14, wherein the at least one of the electrical power supply and the electric ground is performed in a different process when an exposing the photoresist coated substrate with the illumination light is not performed, different from an exposure process for the photoresist coated substrate with the illumination light.

16. The method according to claim 15, wherein the different process includes an exchange process of the photoresist coated substrate that is held by the holder on the first stage with another photoresist coated substrate.

17. The method according to claim 15, wherein a power supply electrical contact, which is connected to a battery of the first stage, of the first portion and a power supply electrical contact of the second portion are to be in contact with each other in order to supply electric power to the battery.

18. The method according to claim 17, wherein a support member, which is provided at the first stage and is arranged to support the photoresist coated substrate, is driven with electric power from the battery such that the support member is moved relative to the holder.

19. The method according to claim 18, a grounding contact, which is electrically connected to the holder, of the first portion and a grounding contact of the second portion are to be in contact with each other in order to ground the holder.

20. The method according to claim 19, wherein the grounding contact of the second portion is arranged to be connected, via a line connected to the movable member, to an external ground portion.

21. The method according to claim 20, wherein at least one of negative pressure and positive pressure is supplied to the first stage, while the first stage is not physically in contact with the movable member, by a gas supply member, different from the power supply member, and a part of which is provided on the first stage.

22. The method according to claim 21, wherein the negative pressure is utilized for absorbing the photoresist coated substrate by at least one of the holder and the support member.

23. The method according to claim 22, wherein the movable member is further arranged to be connected to another line for an electric supply, and a tube for the negative pressure.

24. The method according to claim 23, further comprising:
supplying liquid, by a nozzle member, between a lens and a portion of a surface of the photoresist coated substrate held by the holder on the first stage, the lens being of a plurality of lenses of the projection optical system and arranged at a closest position to an image plane, the nozzle member being arranged adjacent to the lens;
executing a relative movement between the first stage, which is arranged opposite to the lens, and a second stage, which is arranged on the base member and movable relative to the first stage, such that the first and second stages come close to each other; and
moving the first and second stages while the first and second stages are positioned adjacent to each other relative to the lens in a predetermined direction orthogonal to an optical axis of the lens so that the second stage is arranged opposite to the lens in place of the first stage while the liquid is substantially maintained between the lens and the portion of the surface of the photoresist coated substrate.

25. A device fabricating method comprising:
exposing a photoresist coated substrate with illumination light via a projection optical system using the exposure method according to claim 14; and
developing the exposed substrate.

26. The method according to claim 14, wherein
the power supply member includes an actuator that is configured to move the second portion, and
controlling the actuator so that the second portion is electrically in contact with the first portion when the exposing the photoresist coated substrate with the illumination light is not performed.

* * * * *